United States Patent [19]
Tsuruda et al.

[11] Patent Number: 5,872,737
[45] Date of Patent: *Feb. 16, 1999

[54] SEMICONDUCTOR INTEGRATED CIRCUIT DEVICE IN WHICH INFLUENCE OF POWER SUPPLY NOISE ON INTERNAL CIRCUITRY DURING OPERATION OF INPUT/OUTPUT BUFFER IS PREVENTED

[75] Inventors: Takahiro Tsuruda; Kazutami Arimoto, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 833,171

[22] Filed: Apr. 4, 1997

[30] Foreign Application Priority Data

Nov. 1, 1996 [JP] Japan .................................. 8-290963

[51] Int. Cl.$^6$ ................. G11C 7/00; G11C 8/00
[52] U.S. Cl. ................ 365/189.05; 365/189.08; 365/226; 365/230.03; 365/230.08
[58] Field of Search ............... 365/189.05, 189.08, 365/226, 229, 230.03, 230.06, 230.08

[56] References Cited

U.S. PATENT DOCUMENTS 5,202,855  4/1993  Morton ..................... 365/226
5,398,207  3/1995  Tsuchida et al. ............. 365/226
5,555,215  9/1996  Nakagome et al. ............ 365/226

FOREIGN PATENT DOCUMENTS 61-294929  12/1986  Japan .
3-228368   10/1991  Japan .
5-62467     3/1993  Japan .
7-85662     3/1995  Japan .
8-147971    6/1996  Japan .

OTHER PUBLICATIONS

"Low Voltage Circuit Design Techniques for Battery–Operated and/or Giga–Scale DRAM's", Yamagata, et al, IEEE, vol. 30, No. 11, Nov. 1995, pp. 1183–1188.

"High–Speed/High–band Width Design Methodologies For On Chip DRAM Core Multimedia System LSIs", Tsuruda et al., pp. 265–268, IEEE 1996 Custom Integrated Circuits Conference, May 6, 1996.

Primary Examiner—David Nelms
Assistant Examiner—Trong Phan
Attorney, Agent, or Firm—McDermott, Will & Emery

[57] ABSTRACT

In a system chip, power supply lines and ground lines are provided independently for input/output buffer circuit, a logic circuit, memory cell array and so on. The word line is held at a negative potential when not selected. At an initial stage of sense amplifier operation, sense amplifier operates with external power supply potential Vcc directly supplied thereto, and after a prescribed time period, it operates receiving internal power supply potential Vcc as output from an internal voltage converting circuit.

35 Claims, 25 Drawing Sheets

F I G. 20
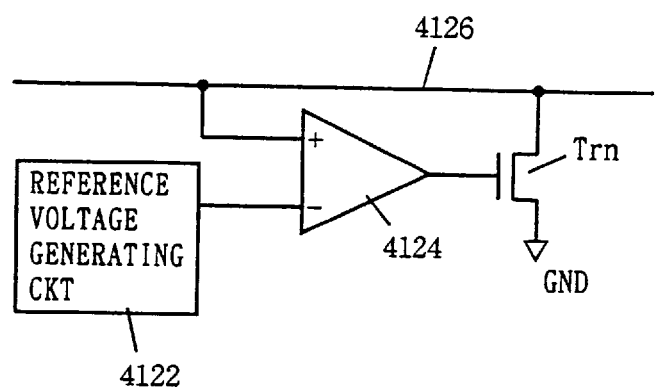

SEMICONDUCTOR INTEGRATED CIRCUIT DEVICE IN WHICH INFLUENCE OF POWER SUPPLY NOISE ON INTERNAL CIRCUITRY DURING OPERATION OF INPUT/OUTPUT BUFFER IS PREVENTED

BACKGROUND OF THE INVENTION

1. Field of the Invention

The present invention relates to a semiconductor integrated circuit device and, more specifically, to a structure of a semiconductor integrated circuit device in which a dynamic semiconductor memory device (hereinafter referred to as a DRAM) and a logic circuitry are mounted together on one chip.

2. Description of the Background Art

Currently, various semiconductor devices such as microcomputers, memory and gate arrays are mounted on electric appliances including personal computers and work stations. Especially, as portable personal computer equipments for multi-media applications have come into wide use, a semiconductor integrated circuit device in which a memory of a large storage capacity is mounted on a system chip has been developed.

Such a semiconductor device has a pad for exchanging signal or data with the outside of the device. When the semiconductor device is sealed in a package, the pad is connected to an external pin terminal. If the semiconductor device is formed on the same chip or wafer as other semiconductor devices, the pad is coupled to an internal line.

There is a large load on the pad for outputting a signal or data, dependent on an input capacitance and line capacitance of the external device. Accordingly, a driver circuit (output buffer circuit) having large current drivability is provided for the output pad, as it needs stored information or signal formed in the device.

Especially when the semiconductor device is sealed in a package and mounted on an electric product, for example, the pin terminal of the semiconductor device is connected to a printed line or the like on the board on which the device is mounted. Further, input capacitance of another semiconductor integrated circuit device connected to the pin terminal and storage capacitance of the printed line are large, it is necessary to charge/discharge the load capacitances (parasitic capacitances) having relatively large capacitance values in a prescribed time period. Therefore, it is necessary that the output buffer circuit (driver circuit) has sufficiently larger current drivability than the current drivability of internal circuitry.

FIG. 29 is a schematic block diagram showing the structure of a system chip 2000 having a DRAM such as described above.

System chip 2000 shown in FIG. 29 has a logic LSI for performing logic processing and a memory LSI for storing data formed on the same chip.

Referring to FIG. 29, system chip 2000 includes a logic processing portion and a memory portion. Commonly to the logic processing portion and a memory portion, there is provided an input/output buffer circuit 400 for input/output of data and signals from and to the outside of the device.

Logic processing portion includes a logic circuit 402 for receiving data and/or signals from input/output buffer circuit 400 and the memory portion, which will be described later, and for performing prescribed processing.

The memory portion includes a memory cell array having dynamic memory cells arranged in a matrix, a DRAM control circuit 404 for controlling access to the memory cell array 406, a word line driver 408 for driving a row (word line) of memory cell array 406 to a potential of a selected state under control of DRAM control circuit 404, a sense amplifier 410 for detecting, amplifying and latching data of a memory cell connected to a selected row in memory cell array 406, and a column decoder 414 for selecting a column of memory cell array 406 under control of DRAM control circuit 404.

The memory portion further includes a voltage converting circuit 412 lowering an external power supply voltage Vcc and supplying an internal power supply voltage to be supplied to DRAM control circuit 404, sense amplifier 410 and so on, and a Vpp generating circuit 416 receiving the external power supply voltage Vcc and generating a boosted potential to be supplied to word line driver circuit 408.

Commonly to input/output buffer circuit 400, logic circuit 402, Vpp generating circuit 416 and voltage converting circuit 412, a power supply line 142 is provided. The power supply line 142 is supplied with an external power supply voltage Vcc from power supply pad 140.

Meanwhile, commonly to input/output buffer circuit 400, logic circuit 402, DRAM control circuit 404, word line driver circuit 408, sense amplifier 410, sense amplifier 410, memory cell array 406 and column decoder 414, a ground power supply line 146 is provided. To the ground power supply line 146, a ground potential GND is supplied through a power supply pad 144.

The structure and operation of input/output buffer circuit 400 in system chip 2000 having such a structure as shown in FIG. 29 will be described.

FIG. 30 is a schematic block diagram showing a structure of an output buffer in a conventional semiconductor memory device disclosed, for example, in Japanese Patent Laying-Open No. 61-294929.

Referring to FIG. 30, in this structure also, the output buffer circuit includes a p channel MOS transistor 3 connected between a power supply load 1a receiving power supply voltage Vcc and an output node 2; an n channel MOS transistor 4 connected between output node 2 and a ground node 1b receiving ground voltage GND; an NAND circuit 5 receiving an internal read data d1 and a data output enable signal ZOE applied through an inverter 7; and an NOR circuit 6 receiving the internal read data d1 and the data output enable signal ZOE.

An output signal from NAND circuit 5 is applied to the gate of MOS transistor 3, and an output signal from NOR circuit 6 is applied to the gate of MOS transistor 4.

There is a relatively large parasitic capacitance CL at output node 2.

Operation of the output buffer circuit shown in FIG. 30 will be described with reference to the diagram of wave forms shown in FIG. 31.

Internal read data d1 changes from an intermediate potential corresponding to a standby state, to the L level. When data output enable signal ZOE is at the "H" level, the output signal from inverter 7 is at the "L" level, the output signal from NAND circuit is at the "H" level and the output signal from NOR circuit 6 is at the "L" level.

Therefore, MOS transistors 3 and 4 are both off, and output buffer circuit is set to an output high impedance state (Hi-Z).

At time T0, when data output enable signal ZOE attains to the active state of "L" level, the output signal from inverter 7 attains to the "H" level, and NAND circuit 5 and NOR circuit 6 both function as inverters. Therefore, output signals from NAND circuit 5 and NOR circuit 6 both attain to the "H" level, and in response, MOS transistor 3 turns off and MOS transistor 4 turns on.

Therefore, output node 2 is coupled, through the MOS transistor which is on, to the ground node 1b and is discharged. Consequently, external read data d1 falls from the high impedance state Hi-Z to the level of the ground potential.

At time T1, when data output enable signal ZOE attains to the "H" level, regardless of the logic level of internal read data D1, output signals from NAND circuit 5 and NOR circuit 6 attain to the "H" level and "L" level, respectively, and the output buffer circuit again attains to the high impedance state.

Thereafter, when another memory cell is selected, data of the "H" level is read and internal read data d1 attains to the "H" level, and data output enable signal ZOE again attains to the "L" level at time T2.

In this state, NAND circuit 5 and NOR circuit 6 again function as inverters, and output signals from these circuits 5 and 6 attain to the "L" level. Accordingly, MOS transistor 3 turns on, and MOS transistor 4 turns off. In response, output node 2 is charged to the level of the power supply voltage Vcc through MOS transistor 3 which is on, and external read data D1 attains to the "H" level.

At time T3, when data output enable signal ZOE again attains to the "H" level, the output buffer circuit is again set to the output high impedance state.

FIG. 32 shows an example of the power supply line and ground line of system chip 2000.

In FIG. 32, the memory portion and the logic portion will be generally referred to as internal circuitry 11.

Referring to FIG. 32, for internal circuitry 11 performing prescribed processing operation and generating internal read data d1 and for output buffer circuit 12, power supply line 10a and ground line 10b are commonly provided.

To the power supply line 10a, power supply potential Vcc is transmitted, and to ground line 10b, ground potential GND is transmitted. When read data signal D1 from output buffer circuit 12 changes from the "L" level to the "H" level, current is supplied from power supply node 1a to output node 2 through MOS transistor 3 as shown in FIG. 30. Output buffer circuit 12 charges large parasitic capacitance CL existing at the output node 2 at high speed, and therefore, MOS transistors 3 and 4 have high current drivability.

Therefore, in such a case as described above, when read data signal D1 from output buffer circuit 12 rises from "L" level to "H" level, current on the power supply line 10a is consumed abruptly, and power supply voltage Vcc on power supply line 10a lowers by about 0.5 V, for example.

When read data signal D1 from output buffer circuit 12 lowers from the "H" level to the "L" level, MOS transistor 4 shown in FIG. 30 is rendered conductive, a large current is quickly discharged from output node 2 to ground node 1b. In this case, because of the large current abruptly discharged from output buffer circuit 12, the potential level of ground line 10b rises by about 0.5 V, for example.

Power supply noise (noise of power supply voltage and ground voltage, respectively) on power supply line 10a and ground line 10b is transmitted to internal circuitry 11. When power supply voltage Vcc is about 5 V, for example, the power supply noise is about $\frac{1}{10}$ of the power supply voltage Vcc and relatively small. Therefore, malfunction caused by the power supply noise is not a problem in internal circuitry 11.

However, as the degree of integration of semiconductor devices has been increased recently, generally the potential level of power supply voltage Vcc is lowered to 3.3 V or lower, in order to reduce power consumption and to realize high speed operation. In that case, the power supply noise of 0.5 V is about $\frac{1}{6}$ of the power supply voltage Vcc. Therefore, there is caused a problem that internal circuitry malfunctions because of the power supply noise, and a signal of "H" level may be erroneously determined to be "L" level or a signal at the "L" level may be erroneously determined to be "H" level signal.

In order to absorb the power supply noise mentioned above, generally decoupling capacitances C1 and C2 are provided near internal circuitry 11 and output buffer circuit 12, respectively, for stabilization, as shown in FIG. 34.

Decoupling capacitances C1 and C2 are connected between power supply line 10a and ground line 10b. When output buffer 12 operates and consumes current on power supply line 10a and power supply voltage Vcc lowers, positive charges stored in decoupling capacitance C2 are supplied to power supply line 10a, suppressing lowering of the power supply voltage Vcc.

Meanwhile, when output buffer circuit 12 operates and discharges current to the ground line 10b, the discharged current is absorbed by decoupling capacitance C2, suppressing rise in the ground voltage GND.

Decoupling capacitance C1 provided near internal circuitry 11 suppresses power supply noise of voltages vcc and GND to internal circuitry 11, and further, power supply noise caused by the operation of output buffer 12 can be prevented from being transmitted to internal circuitry 11.

It is necessary for the decoupling capacitance to suppress power supply noise by the stored charges (positive and negative charges). Therefore, in order to suppress lowering of power supply voltage Vcc and rise of the ground voltage GND, it is necessary that the decoupling capacitance has a capacitance value of several hundreds pico farad, for example about 450 pF.

By the decoupling capacitances C1 and C2, power supply.line 10a and ground line 10b are capacitively coupled. The power supply voltage Vcc on power supply line 10a lowers quickly, and it changes in alternate manner. Therefore, as shown in FIG. 35, because of the decoupling capacitance C2, power supply line 10a and ground line 10b are coupled in alternating manner, lowering of potential of power supply voltage Vcc is transmitted to ground line 10b, and ground voltage GND lowers.

Decoupling capacitances C1 and C2 absorb rise of the ground voltage GND by the stored load. Therefore, when ground voltage GND lowers, it is not possible to absorb the lowering of potential by the decoupling capacitances C1 and C2.

Under such circumstances, there will be a following problem when the internal circuitry 11 is a circuit for driving the memory cell array, for example.

FIG. 36 shows a memory cell structure. Referring to FIG. 36, memory cell MC includes an access transistor QM formed of an n channel and MOS transistor having one conduction node connected to a bit line BL, the other conduction node connected to a storage node SN and a gate connected to a word line WL, and a memory cell capacitor CM having one electrode connected to the storage node SN and the other electrode receiving a cell plate potential Vcp. Generally, cell plate potential Vcp is held at an intermediate potential level of (Vcc+GND)/2. Memory information is stored in the form of charges at storage node SN.

Assume, as an example, that the word line WL is not selected and its potential is 0 V. When output buffer circuit 12 is in operation, bit line BL is connected to a selected word line (word line WL' which is different from the shown word line WL), and in accordance with the data stored in a memory cell connected to the bit line BL, it is set to the "H" level or "L" level.

In the following, it is assumed that the potential of bit line BL is at the "L" level, that is, 0 V. At that time, referring to FIG. 35, when output buffer operates and the power supply voltage Vcc lowers, the ground voltage GND lowers correspondingly. The lowering of the ground voltage GND is transmitted to internal circuitry 11 as shown in FIG. 34, and the potential 0 V of the bit line BL electrically connected to the output buffer circuit 12 is shifted to the negative potential side. Meanwhile, since the potential of word line WL is at 0 V, the potential difference between the gate and source of memory cell transistor QM will be larger than 0 V. Consequently, memory cell transistor QM is rendered weakly conductive, and charges (positive charges) stored in storage node SN are discharged to bit line BL. More specifically, stored charges of a memory cell which is not selected reduces, degrading data retention characteristic of the memory cell. In the worst case, data stored in a non-selected memory cell may possibly be destroyed.

Assume that the selected memory cell holds stored data at the "H" level and the potential of the bit line BL is held at the level of the power supply voltage Vcc. When the potential Vcc of the bit line BL lowers because of power supply noise in this state, the potential level of write data at the "H" level of the selected memory cell lowers, and it becomes impossible to store necessary charges in storage node SN. In this case, at the time of writing or restore of the data at the "H" level, amount of charges at the storage node SN reduces, degrading charge retention characteristic of the memory cell.

The charge retaining characteristic of the memory cell while the output buffer circuit is in operation as described above is referred to as dynamic refresh characteristic. On the other hand, charge retention characteristic of the memory cell while the output buffer circuit or the like is not in operation is referred to as a static refresh characteristic. Generally, since leak current of a memory cell transistor increases because of the influence of power supply noise as described above, dynamic refresh characteristic is degraded from the static refresh characteristic. Especially in a memory cell relatively close to the output buffer circuit or when the substrate bias (negative potential) has a small absolute value, the degree of degradation is considerable.

In the output buffer circuit 12, when ground voltage GND on ground line 12b lowers, the potential difference between the gate and the source of MOS transistor 4 for driving to the "L" level becomes larger, the MOS transistor is weakly turned on, and current flows from output node 2 to ground node 1b. Consequently, potential level of power supply voltage Vcc further lowers, the ground potential GND also lowers correspondingly, and power supply noise becomes larger. Further, potential level of read data signal D1 also lowers, making it difficult to read data correctly.

Further, at this time, current flows from the power supply node 1a to the ground node 1b through MOS transistors 3 and 4, causing the problem of increased current consumption in the output buffer circuit.

In a semiconductor memory device, the number of bits of input/output data tends to be increased, the number of output buffer circuits also tends to increase accordingly, and power supply noise of the output buffer circuit tends to be larger. In a semiconductor integrated circuit device such as a logic circuit, the number of output signals tends to be increased as the degree of integration becomes higher, the number of buffer circuits also tends to increase accordingly, and the problem of power supply noise similarly becomes more serious.

In order to make smaller the power supply noise mentioned above, what is necessary is to lower the speed of charging/discharging the output node 2. However, in that case, the data output speed also lowers, and as a result, it becomes impossible to provide output signals of data at high speed.

As a method of suppressing degradation of dynamic refresh characteristic, the potential level of the word line which is at a standby state may be set to a negative potential. More specifically, when the potential level of the word line is lower than the bit line BL which is at the ground potential, it is possible to prevent memory cell transistor QM from being rendered weakly conductive, even when the potential level of the bit line lowers because of the power supply noise.

FIG. 37 is a schematic block diagram showing a structure of a potential setting circuit 100 which can apply a negative potential to a word line WL which is not selected, disclosed in *IEEE JOURNAL OF SOLID-STATE CIRCUITS*, VOL30, No.11 NOVEMBER 1995 pp.1183~1188.

Potential setting circuit 100 includes a decoder circuit 114 responsive to an address signal for setting a low selection signal RS to an active state ("L" level); a pair of p channel MOS transistors 102 and 104 both receiving an internal boosted potential Vpp at their sources and having gates and drains connected to each other; a pair of n channel MOS transistors 106 and 108 receiving a negative potential Vn at their sources, having gates and drains connected to each other and having drains connected to the drains of p channel MOS transistors 102 and 104, respectively; an n channel MOS transistor 110 connected between the drain of p channel MOS transistor 104 and an output node of decoder circuit 114 and having its gate potential fixed at the potential Vcc; and a p channel MOS transistor 112 connected between the drain of n channel MOS transistor 108 and the output node of decoder circuit 114 and having its gate potential fixed at the potential GND.

The word line WL is connected to a node between the drain of transistor 102 and drain of transistor 106.

However, in the potential setting circuit 100, while the word line WL is not selected and a negative potential is applied, the negative potential Vn is applied to the gate of transistor 104 and the internal boosted potential Vpp is applied to the source of transistor 104, degrading reliability of the gate insulating film of the transistor.

Further, when this circuit is to be mounted on a system chip together with a DRAM, there will be the following problem.

More specifically, when an LSI having a DRAM and a circuit for performing a prescribed logic operation on the data output from DRAM both formed on the same chip is to be manufactured, thicknesses of an oxide film of MOS transistors constituting the DRAM and the logic operation circuit are generally set to a common thickness.

More specifically, assume that a chip having aforementioned elements mounted together is manufactured through a process flow for manufacturing the DRAM. In the DRAM, in order to write "H" level completely in the memory cell, boosted level (hereinafter referred to as Vpp) is necessary as the voltage to be supplied to the selected word line, and in order to ensure reliability of the gate oxide film, the thickness of the oxide film should be thick. However, thick oxide film causes degradation in speed of operation of MOS transistors which are required of high speed operation.

The aforementioned boosted level Vpp is supplied not only to the selected word line. For example, when a so-called shared sense amplifier structure is employed, for conduction between the bit line in the memory cell array and the transfer gate transistor of the bit line in the sense amplifier, it is necessary to supply the boosted level to the gate. In that case also, it is necessary to avoid voltage lowering in the transfer gate transistor.

When the thickness of the gate oxide film is made thin for the entire chip having the aforementioned elements mounted together, in order to suppress degradation of high speed operation of the peripheral circuits mentioned above, it becomes difficult to ensure reliability of the gate oxide film in the circuits using boosted level Vpp.

Further, a process flow in which thickness of the gate oxide film is changed circuit by circuit makes the process too complicated, hindering reproductivity and reliability.

SUMMARY OF THE INVENTION

An object of the present invention is to provide semiconductor integrated circuit device in which influence of power supply noise to internal circuitry when a buffer circuit is in operation is reduced.

Another object of the present invention is to provide a semiconductor integrated circuit device in which charge retention characteristic of memory cells is improved.

A still further object of the present invention is provide a semiconductor integrated circuit device which is capable of optimizing power supply structure for a DRAM portion and other logic circuit portion, enabling high speed operation of the circuits, even when a DRAM is mounted with other elements on a system chip.

A still further object of the present invention is to provide a semiconductor integrated circuit device for manufacturing a system chip having a DRAM and a logic circuit mounted together, even when a common process is used, reliability of the gate oxide film of MOS transistors constituting the circuit can be improved.

Briefly stated, the present invention relates to a semiconductor integrated circuit device operating supplied with an external first power supply potential and second power supply potential higher than the first power supply potential, including an internal voltage converting circuit, a memory circuit for holding data, a logic operation means, and an output buffer circuit. The internal voltage converting circuit receives the second power supply potential and supplies an internal power supply potential between the first and the second power supply potential and supplies an internal power supply potential between the first and the second power supply potentials. The memory circuit includes a plurality of memory cells arranged in a matrix, each holding data, with one of the data levels to be stored corresponding to the internal power supply potential, a plurality of word lines provided corresponding to the rows of the plurality of memory cells, and row selecting means for selecting a corresponding row of memory cells by setting the potential of a selected word line to the second power supply potentials. The logic operation circuit operates using the first and second power supply potentials as one and the other operational power supply potentials, performs a prescribed logic operation on the data held by the memory means and outputs the result. The output buffer circuit operates using the first and second power supply potentials as one and the other operational power supply potentials, buffers the output signal from the logic operation means an outputs the result.

Preferably, the semiconductor integrated circuit device further includes a fourth power supply line for supplying the first power supply potential, a second power supply line for supplying the second power supply potential, a third power supply line for supplying the first power supply potential, provided separate from the first power supply line, a fourth power supply line for supplying the second power supply potential, provided separate from the second power supply line, a fifth power supply line for supplying the first power supply potential, provided separate from the first and third power supply lines, and a sixth power supply line for supplying the second power supply potential, provided separate from the second and fourth power supply lines. The internal voltage converting circuit operate using the first power supply potential on the first power supply line and the second power supply potential on the second power supply line as operational power supply potentials, the logic operation circuit operates using the first power supply potential on the third power supply line and the second power supply potential on the fourth power supply line as operational power supply potentials, and the buffer circuit operates using the first power supply potential on the fifth power supply line and the second power supply potential on the sixth power supply line as operational power supply potentials.

More preferably, the semiconductor integrated circuit device further includes a pseudo ground level generating circuit for outputting a pseudo ground level which is higher than the first power supply potential and lower than the internal power supply voltage, the memory circuit further includes a plurality of bit line pairs provided corresponding to columns of memory cells, and a plurality of sense amplifiers operating using the internal power supply voltage and the pseudo ground level as one and the other operational power supply potentials, for amplifying potential difference generated between paired bit lines in accordance with data held by a memory cell selected by the row selecting circuit, the row selecting circuit selects a corresponding row of memory cells by setting potential of a selected word line to the second power supply potential, the semiconductor integrated circuit device further includes a power supply switch circuit for setting the potential of a non-selected word line to the first power supply potential, receiving the first power supply potential and the pseudo ground level, for supplying, in response to the start of row selecting operation, the first power supply potential to the plurality of sense amplifiers for a prescribed period and thereafter switched to supply the pseudo ground level, and the potential of the non-selected word line is kept lower than the potential of the bit line.

According to another aspect, the present invention relates to a semiconductor integrated circuit device operating supplied with an external first power supply potential and a second power supply potential higher than the first power supply potential, which includes an internal voltage converting circuit, a standby potential supplying circuit, a boosting circuit, a memory circuit for holding data, a logic operation circuit and a buffer circuit. The internal voltage converting circuit receives the second power supply potential and supplies an internal power supply potential between the first and second power supply potentials. The standby potential supplying circuit operates using the first and second power supply potentials as one and the other operational power supply potentials, and supplies a third power supply potential which is lower than the first power supply potential and corresponds to a potential of a word line which is not selected. The boosting circuit operates using the first and second power supply potentials as one and the other operational power supply potentials, and outputs a first power supply potential higher than the second power supply potential as an internal boosted potential. The memory circuit includes a plurality of memory cells arranged in a matrix for holding data corresponding to either the first power supply potential or the internal power supply potential, a plurality of word lines provided corresponding to rows of the plurality of memory cells, and row selecting means for selecting, by setting potential of a selected word line to the internal boosted potential, the corresponding row of memory cells and holding the potential of non-selected word lines at a third power supply potential. The logic operation circuit operates using the first and second power supply potentials as one and the other operational power supply potentials, performs a prescribed logic operation on the data held by the memory means and outputs the result. The buffer circuit operates using the first and second power supply potentials as one and the other operational power supply potentials, buffers and outputs the output signal from the logic operation means.

Therefore, an advantage of the present invention is that, in a semiconductor integrated circuit device having a memory circuit, a logic operation circuit and a buffer circuit mounted together, a boosting circuit is not necessary in the memory circuit, and hence power consumption can be reduced.

Another advantage of the present invention is that power supply noise caused by the operation of the output buffer circuit does not affect the operation of the memory circuit and the like, as power supply lines for supplying power supply potentials to the memory circuit, the logic operation circuit and buffer circuit are provided separate from each other.

A still further advantage of the present invention is that in a semiconductor integrated circuit device having a memory circuit, a logic operation circuit and a buffer circuit mounted together, word lines of the memory circuit are set to a negative potential when not selected, so that dynamic refresh characteristic of the memory circuit can be improved.

A still further advantage of the present invention is that dynamic refresh characteristic of the memory circuit can be improved as the bit line potential in the non-selected state is not lower than the pseudo ground level and the potential level of the non-selected word line is smaller than the pseudo ground level.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a schematic block diagram showing a structure of the pseudo ground level generating circuit 418.

DESCRIPTION OF THE PREFERRED EMBODIMENTS

[First Embodiment]

Figure 1:
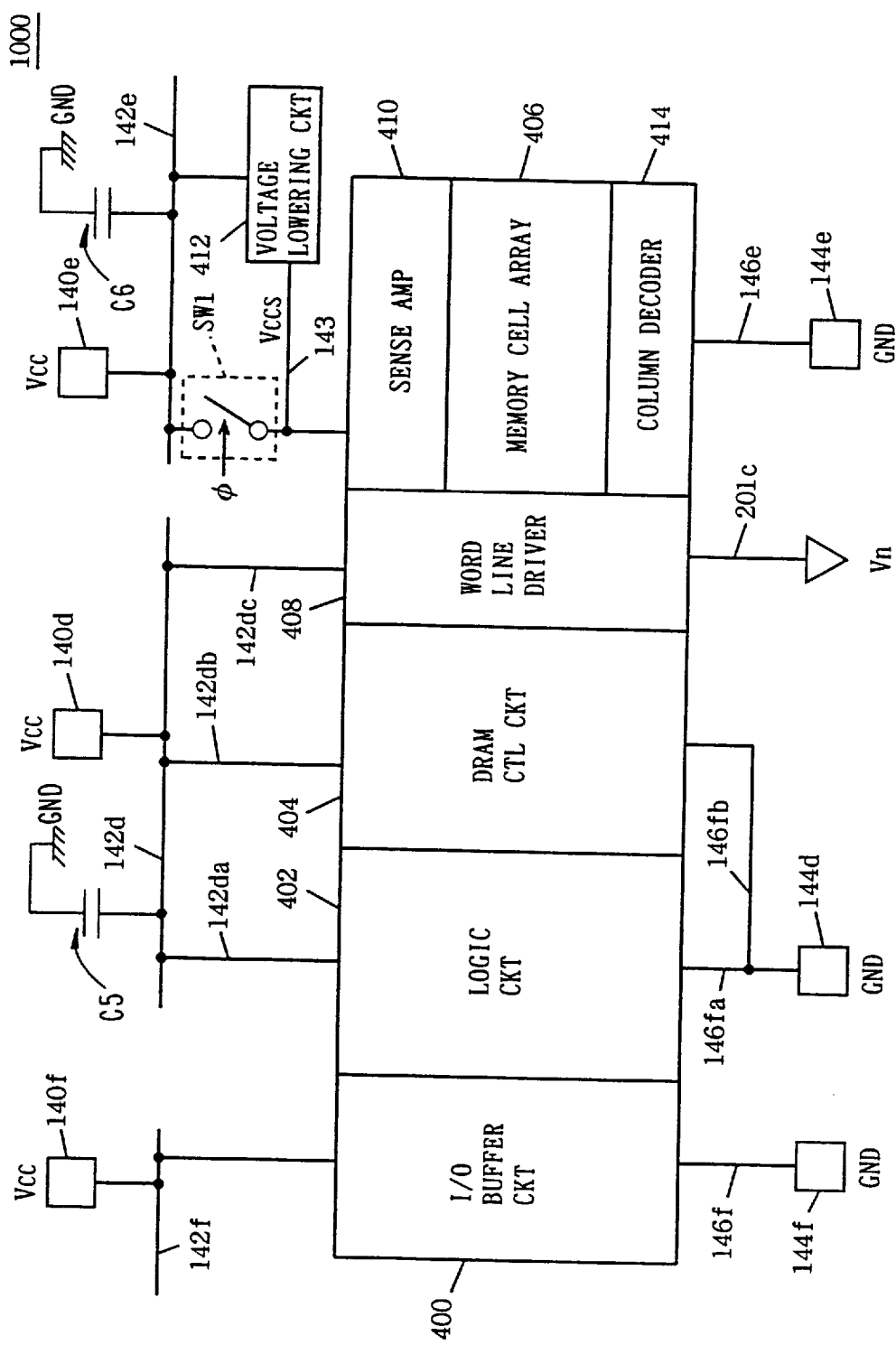
FIG. 1 is a schematic block diagram showing a structure of a system chip 1000 in accordance with a first embodiment of the present invention.

FIG. 1 is a schematic block diagram showing a structure of a system chip 1000 in accordance with a first embodiment of the present invention.

The system chip 1000 shown in FIG. 1 has a logic LSI for performing logic processing and a memory LSI for storing data formed on the same chip.

Referring to FIG. 1, system chip 1000 includes the logic processing portion and a memory portion. Commonly to the logic processing portion and a memory portion, an input/output buffer circuit 400 for inputting/outputting data and signals from and to the outside of the chip is provided.

The logic processing portion includes a logic circuit 402 for receiving data and/or a signal from input/output buffer circuit 400 and from the memory portion, which will be described later, and for performing prescribed processing.

The memory portion includes a memory cell array 406 having dynamic memory cells arranged in a matrix, a DRAM control circuit 404 for controlling access to the memory cell array 406, a word line driver 408 for driving a row (word line) of memory cell array 406 to a selected state under control of DRAM control circuit 404, a sense amplifier band 410 for detecting, amplifying and latching data of memory cells connected to the selected row in memory cell array 406, and a column decoder 414 for performing column selecting operation of the memory cell array under control of DRAM control circuit 404.

Logic circuit 402 may simply perform a prescribed logic operation on data read from or written to memory cell array 406. DRAM control circuit 404 may be adapted to control memory cell selecting operation of memory cell array 406 in accordance with a control signal and an address signal applied through input/output buffer 400.

Alternatively, logic circuit 402 may be adapted to such that the logic circuit performs in accordance with data and a control signal applied through input/output buffer circuit 400, a prescribed processing on the data, generates write data to memory cell array in accordance with the control signal, and controls operation of the DRAM control circuit 404 in accordance with the control signal.

DRAM control circuit 404 performs memory cell selecting operation in accordance with data, a control signal and an address signal applied from input/output buffer circuit 400 or from logic circuit 402.

Sense amplifier band 410 includes sense amplifier circuits provided corresponding to respective columns (bit line pairs) of memory cells of memory cell array 406. The sense amplifier circuits each have a latch type sense amplifier structure including cross coupled MOS transistors for differentially amplifying potential of the corresponding column (bit line pair).

Commonly to logic circuit 402, DRAM control circuit 404 and word line driver 408, a power supply pad 140d is provided. Commonly to logic circuit 402 and DRAM control circuit 404, a ground pad 144d is provided.

Logic circuit 402 receives one operational power supply voltage Vcc from power supply pad 140d through a main power supply line 142d and a sub power supply line 142da, and receives the ground voltage GND from ground pad 140d through ground line 146fa.

DRAM control circuit 404 receives the power supply voltage Vcc from power supply pad 140d through main power supply line 142d and sub power supply line 142db, and receives the ground voltage GND from ground pad 144d through a ground line 146fb.

Word line driver 408 receives the power supply voltage Vcc from power supply pad 140d through main power supply line 142d and a sub power supply line 142dc, and receives a negative bias voltage Vn through a substrate bias voltage transmitting line 201c.

By operating logic circuit 402 and DRAM control circuit 404 externally, using power supply voltage Vcc (for example, 3.3 V) as one operational power supply voltage, these circuits operate at high speed.

When sense amplifier 410 has a shared sense amplifier structure and is arranged between the bit line pairs, DRAM control circuit 404 generates a bit line separating signal for separating non-selected bit line pairs. The "H" level of the bit line separating signal is set higher than the "H" level of the memory cell array 406. This is to eliminate voltage loss caused by the threshold voltage of the separating transistor.

Accordingly, DRAM control circuit 404 uses power supply voltage Vcc as it is. Word line driver 408 drives a selected word line of memory cell array 406 to the "H" level. The "H" level in this case is also set higher than the "H" level of the data stored in the memory cell, so as to eliminate influence of the threshold voltage of memory cell transistors.

As will be described later, the "H" level to the memory cell array is the internal power supply voltage Vccs supplied from voltage converting circuit 412. Therefore, in order to output a signal at the "H" level, word line driver 408 uses the power supply voltage Vcc as it is.

Word line driver 408 receives as the other operational power supply voltage the negative bias voltage Vbb, in order to prevent conduction of transistors of nonselected memory cell by the potential lines caused by capacitive coupling of non-selected word lines in the memory cell array 406 and hence to prevent stored charges from flowing out.

For the sense amplifier band 410, a power supply pad 140e and a ground pad 144e are provided. Voltage converting circuit 412 lowers the power supply voltage Vcc on power supply line 142e coupled to power supply pad 140e to generate an internal lowered voltage Vccs (for example, 2.0 V), and supplies it to sense amplifier band 410 through a sense amplifier power supply line 143.

Between sense amplifier power supply line 143 and power supply line 142e, there is provided a switching circuit SW1 which is rendered conductive in response to a control signal φ. Switching circuit SW1 is rendered conductive when power of the semiconductor device is turned on and quickly elevates the internal lowered voltage Vccs.

Switching circuit SW1 is turned on at the beginning of the operation of sense amplifier 410 so as to increase voltage level of power supply voltage Vccs of sense amplifier power supply line 143, suppressing lowering of the power supply voltage Vccs while the sense amplifier is in operation, enabling high speed sensing operation.

The other power supply voltage to the sense amplifier band 410 is supplied from ground pad 144e through ground line 146e.

Therefore, sense amplifier 410 drives the potential on the corresponding column (bit line pair) to the voltage levels of the ground voltage GND and internal lowered voltage Vccs, finally. As the internally lowered voltage Vccs is used as one power supply voltage for the sense amplifier 410, insulator breakdown characteristics of the memory cell transistors can be compensated for even when the memory cells are reduced in size as the storage capacity of the memory cell array 406 is increased.

Here, it is possible to provide decoupling capacitors for power supply lines 142d and 142e, respectively.

More specifically, it is possible to provide a decoupling capacitor C5 between power supply line 142d and ground, and decoupling capacitor C6 between power supply line 142e and the ground.

For input/output buffer circuit 400, power supply pad 140f and ground pad 144f are provided exclusively. To input/output buffer 400, power supply voltage Vcc is supplied from power supply pad 140f through power supply line 142f, and ground voltage GND is supplied from ground pad 144f through ground line 146f.

Input/output buffer circuit 400 utilizes power supply voltage Vcc from power supply pad 140f and the ground voltage GND from ground pad 144f as operational power supply voltages.

As described above, in the system chip, a power supply pad for input/output buffer circuit 400, especially for the output circuit and the ground pad are provided separate from the pad for internal circuitry (such as DRAM), so that influence of power supply noise when the input/output buffer circuit (especially, output circuit) is in operation on the internal circuitry can be prevented, and therefore a system chip having high reliability and operating stably can be realized.

Further, the above described effect can further be enhanced by providing a decoupling capacitor for the power supply line mentioned above.

Figure 2B:
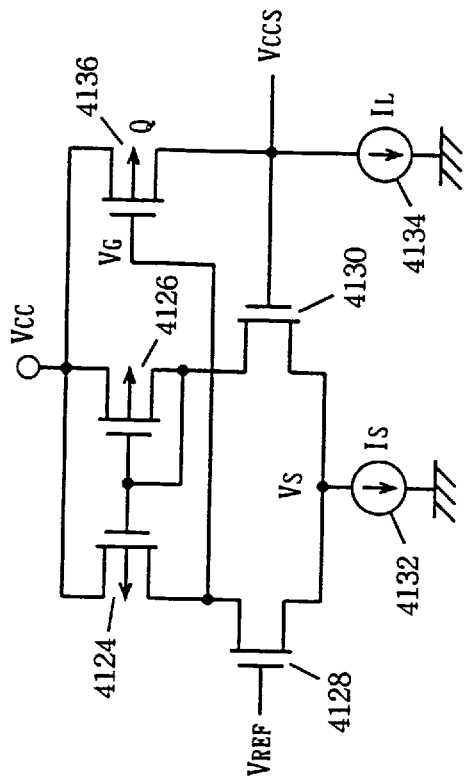
FIG. 2b shows details of the structure.
Figure 2A:
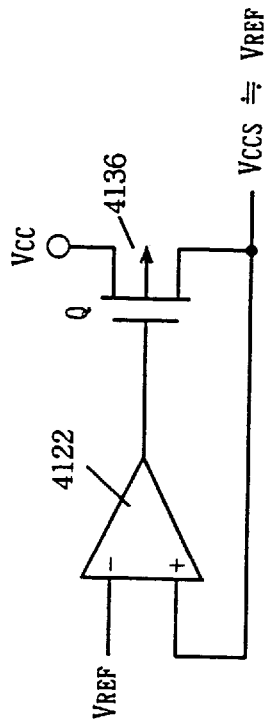
FIG. 2a is a schematic block diagram showing a structure of a voltage converting circuit 412.

FIGS. 2a and 2b show a structure of the voltage converting circuit 412 shown in FIG. 1, where FIG. 2a is a schematic block diagram showing the structure of voltage converting circuit 412 and FIG. 2b shows specific circuit structure.

Referring to FIG. 2a, voltage converting circuit 412 includes a comparing circuit 4122 for detecting potential difference between a reference voltage VREF and an output voltage Vccs, and a PMOS transistor 4136 which is controlled in accordance with the result of comparison.

More specifically, reference voltage $V_{REF}$ is input to a minus node of the comparing circuit, gate potential of P channel MOS transistor 4136 is driven by the output potential from comparing circuit 4122, and P channel MOS transistor 4136 couples power supply potential Vcc with an output node in accordance with the gate potential. By coupling the output node with the other input end (+node) of comparing circuit 4122, a negative feedback loop is formed.

An internal power supply voltage Vccs of which voltage is approximately the same as reference voltage VEF is output from the output node.

FIG. 2b shows a circuit structure when a current mirror differential amplifier is used as the comparing circuit 4122. The current mirror differential amplifier includes: a pair of P channel MOS transistors 4124 and 4126 both receiving power supply voltage Vcc at their sources and forming a current mirror circuit; an N channel MOS transistor 4128 having its drain connected to the drain of P channel MOS transistor 4124 and receiving at its gate the reference voltage $V_{REF}$; an N channel MOS transistor 4130 having its drain connected to the drain of P channel MOS transistor 4126 and its gate connected to the output node; a constant current source 4132 connected between the ground and the sources of N channel MOS transistors 4128 and 4130; and a P channel MOS transistor 4136 receiving at its gate the potential at a node between P channel MOS transistor 4124 and N channel MOS transistor 4128.

In FIG. 2b, constant current source 4134 is employed for representing a load.

The operation will be briefly described in the following.

When a transitional current flows from the output node to the ground through the load connected to the output node, P channel MOS transistor 4136 functions as an impedance having a prescribed value. Accordingly, the drain voltage Vccs of MOS transistor 4136 changes to the negative side. When the output voltage Vccs gradually becomes lower than the reference voltage $V_{REF}$, gate voltage of P channel MOS transistor 4136 further lowers, and transistor 4136 turns on. Consequently, transistor 4136 supplies current to the load and the output node is charged. When such charging is continued to a certain level and the potential Vcc reaches and exceeds the reference voltage $V_{REF}$, then the gate voltage of transistor 4136 rises, the transistor 4136 turns off, and charging operation stops.

In the above described operation, the larger the change of the drain potential of transistor 4136 to the negative side, the faster the load is charged, as the change is amplified and used as the gate voltage of transistor 4136.

By the above described operation, the change in potential Vcc as is suppressed, and a potential which approximately the same as the reference potential $V_{REF}$ is output to the output node.

As for the method of generating the reference potential $V_{REF}$, as a simplest method, a plurality of diode connected N channel MOS transistors and a constant current source may be connected between the power supply potential Vcc and ground potential, and a potential at a prescribed node between the plurality of diode connected transistors may be used.

Figure 3:
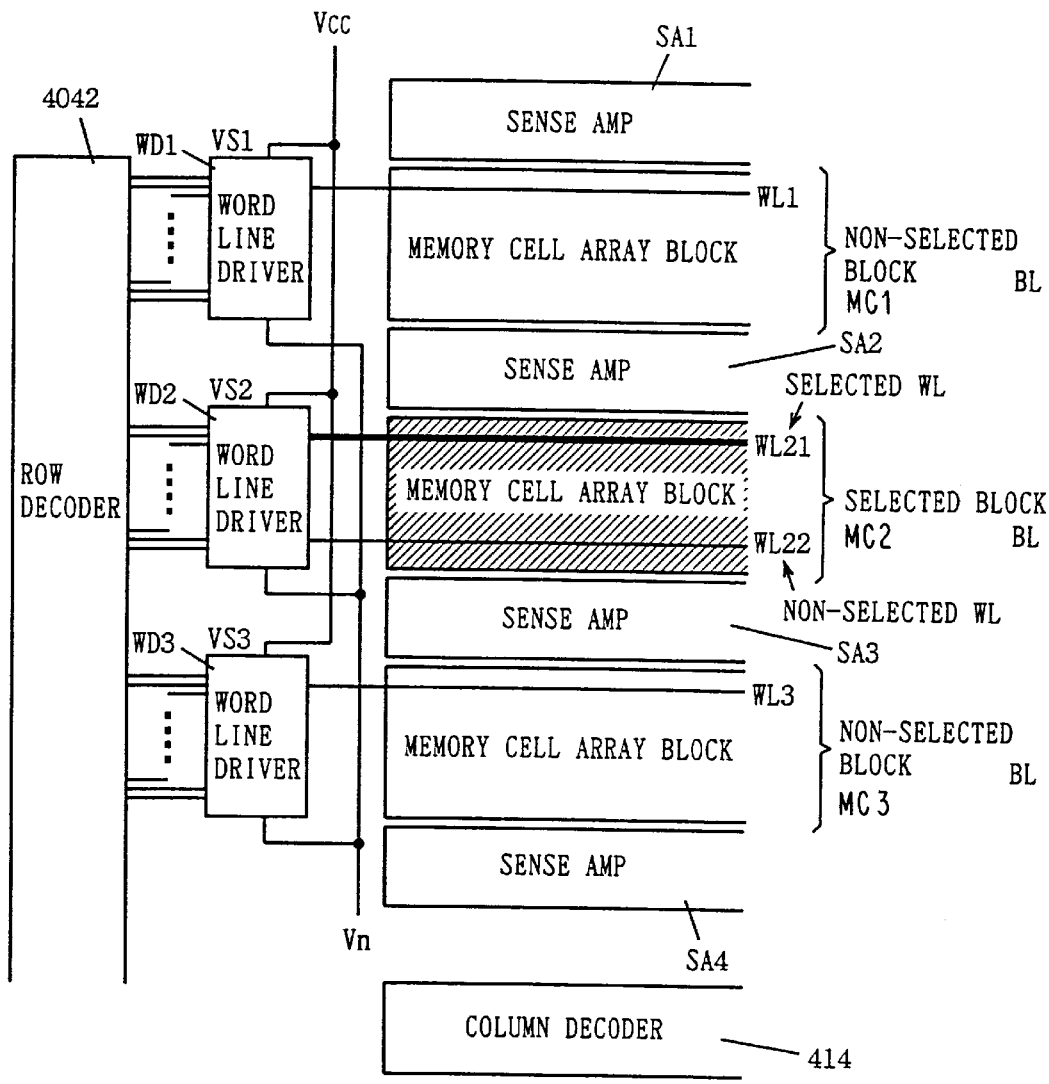
FIG. 3 is a partially enlarged schematic diagram of memory cell array 401 and word line driver 408 shown in FIG. 1.

FIG. 3 is a schematic block diagram showing details of memory cell array 406, sense amplifier 410, word line driver 408 and column decoder 414 shown in FIG. 1.

It is assumed that memory cell array 406 is divided into a plurality of memory cell array blocks MC1, MC2 and MC3. The plurality of memory cell array blocks MC1 to MC3 are arranged between sense amplifier bands SA1, SA2, SA3 and SA4, respectively, and word line drivers WD1 to WD3 are provided corresponding to memory cell array blocks MC1 to MC3, respectively. A word line driving signal is applied to the word line drivers WD1 to WD3 from row decoder 4042.

Word line drivers WD1 to WD3 drive word lines of the corresponding memory cell array blocks MC1 to MC3.

Therefore, at a portion represented as word line driver 408 in FIG. 1, word line driver circuits WD1 to WD3 are arranged corresponding to the respective memory cell array blocks. Row decoder 4042 is included in DRAM control circuit in FIG. 1.

As there are a plurality of memory cell array blocks as shown in FIG. 3, the sense amplifier band 410 of FIG. 1 is arranged alternately between the memory cell array blocks.

FIG. 3 shows, as an example, memory cell array 406 divided into three blocks. However, the present invention is not limited thereto, and it can be applied to a general memory cell array block arrangement.

To each of the word line driver circuits WD1 to WD3, a negative potential Vn from a negative potential generating circuit, which will be described later, and the power supply voltage Vcc are supplied.

Therefore, when memory cell array block BLK2 is selected, for example, the potential of a selected word line WL21 among the word lines in the memory cell array block is held at the power supply potential Vcc by word line driver circuit WD2. Meanwhile, the potential level of a non-selected word line WL22 is held at the potential Vn.

Meanwhile, the potential level of word lines in non-selected memory cell array blocks BLK1 and BLK3 are held at the potential Vn (negative potential) by the corresponding word line driver circuits WD1 and WD3.

Figure 36:
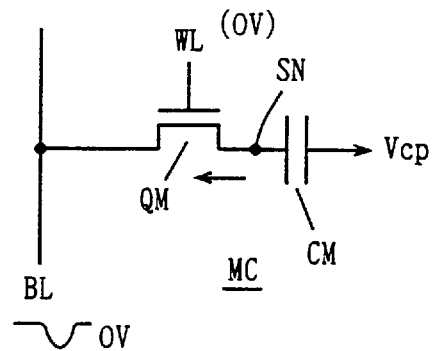
FIG. 36 shows specific problems of the conventional semiconductor integrated circuit device.
Figure 37:
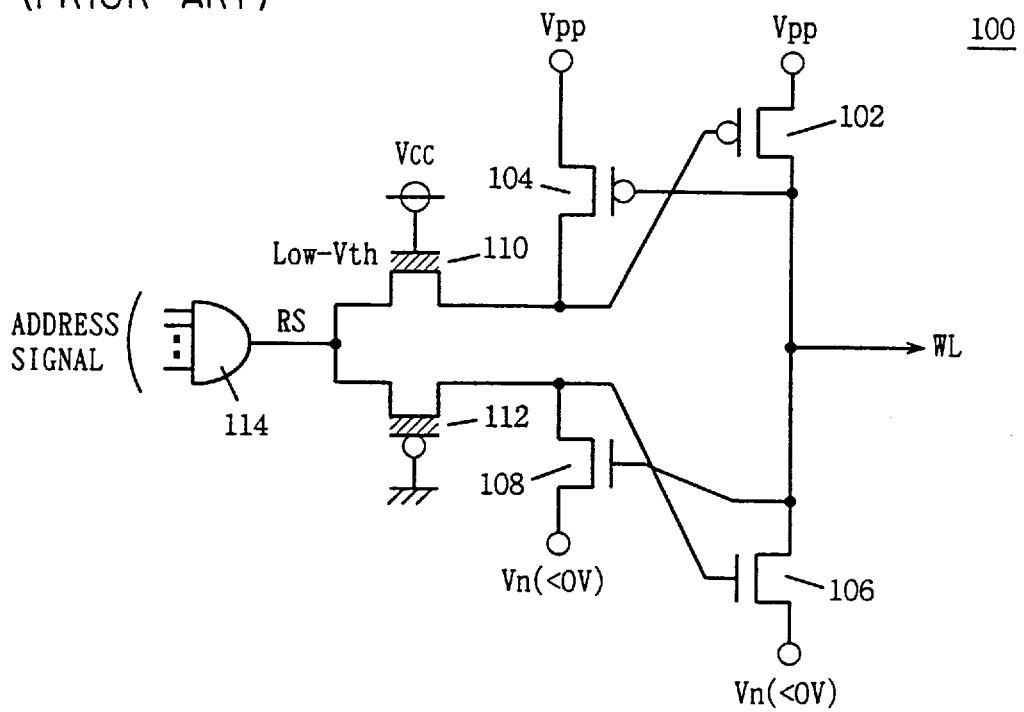
FIG. 37 shows a structure of a conventional potential setting circuit 100.

As described above, since the potential level of the non-selected word line is kept at a negative potential, even when the potential level of the bit lines falls to the negative side because of the power supply noise as shown in FIG. 36, memory cell transistor QM is not rendered weakly conductive. Therefore, undesirable discharge of the charges stored in the memory cell capacitor CM and hence the loss of the stored information can be prevented.

Figure 4:
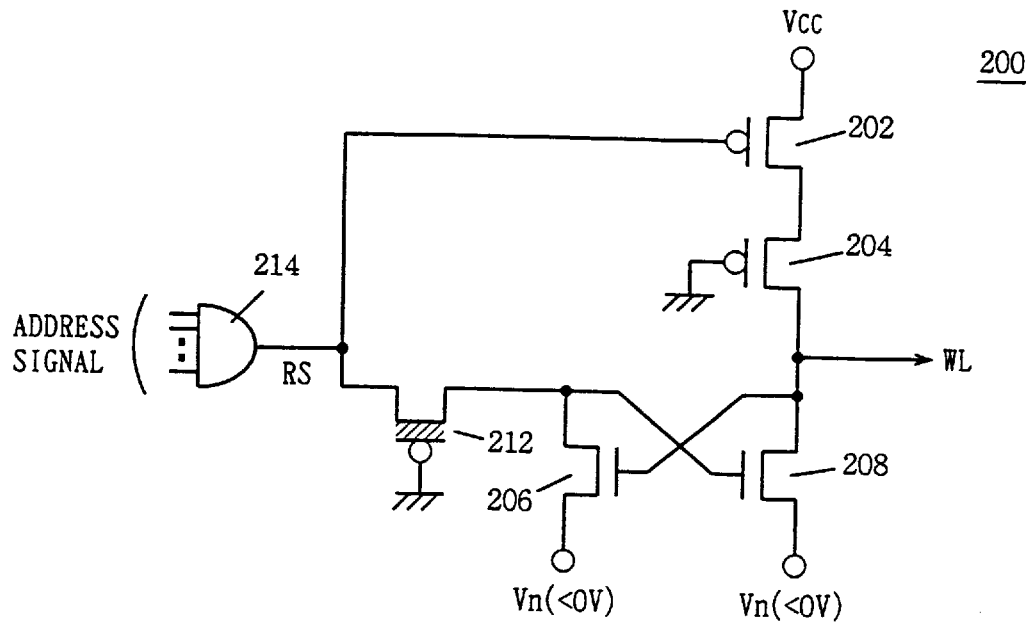
FIG. 4 is a schematic block diagram showing a structure of a potential setting circuit 200.

FIG. 4 is a schematic diagram showing a structure of potential setting circuit 200 included in word line driver circuits WD1 to WD3 and row decoder 4042 shown in FIG. 3, for setting the potential level of the corresponding word line to a prescribed potential level in accordance with the state of selection.

As already described, potential setting circuit 200 is a level conversion type driver circuit for setting, when the corresponding word line is not selected, the word line potential to a negative potential.

Potential setting circuit 200 includes a decode circuit 214 for setting, when it is detected that the corresponding word line WL is selected in accordance with an externally applied address signal, a row selecting signal RS to an active state ("L" level); a P channel MOS transistor 202 receiving at its source the power supply potential Vcc and at its gate the signal RS; a P channel MOS transistor 204 receiving at its gate the ground potential, and connected between the corresponding word line and drain of P channel MOS transistor 202; and a pair of N channel MOS transistors 206 and 208 receiving at their sources the negative potential Vn and having their gates and drains cross coupled to each other. The drain of transistor 208 is connected to the corresponding word line. Decode circuit 214 is included in row decoder 4042.

Potential setting circuit 200 further include a P channel MOS transistor 212 connected between the output node of decode circuit 214 and the drain of N channel MOS transistor 206, and receiving at its gate the ground potential.

The operation of potential setting circuit 200 will be briefly described. Assume that word line WL is not selected and the signal RS is at the "H" level. At this time, P channel MOS transistor 202 is non-conductive. Meanwhile, N channel MOS transistor 208 is rendered conductive, receiving at its gate the signal RS which is at the "H" level, and the potential level of the word line is kept at the potential Vn.

Accordingly, if there is no P channel MOS transistor 204, the potential level at the drain of P channel MOS transistor 202 would be the potential level vn which corresponds to the potential level of a non-selected word line, and the potential level of the gate would be Vcc which is the level of the signal RS in the non-selected state. In that case, a high potential difference (Vcc+|Vn|) would be applied to the gate oxide film of transistor 202. This leads to degraded reliability of the gate oxide film.

As there is provided P channel MOS transistor 204, when the word line potential is Vn of the non-selected state, the drain potential of transistor 204 is the word line potential Vn, the source is at the floating state (which is approximately the threshold potential Vthp of the transistor), and the gate is at 0 V. Therefore, in P channel MOS transistor 202, the potential level of the drain is at the floating state (approximately VthpV), and the gate potential is Vcc. Accordingly, potential difference between the gate and the drain of transistor 202 can be reduced, and reliability of the gate oxide film is ensured.

Here, transistor 212 prevents, when word line WL is selected and its potential level is Vcc, the N channel MOS transistor 206 from being rendered conductive, and hence prevents direct application of the potential to the decoder circuit 214. More specifically, the gate potential of P channel MOS transistor 212 is fixed at the ground level (0 V), and hence even when transistor 206 is rendered conductive, the potential level on the side of the decoder would not be lower than 0 V.

In this manner, the potential level of the word line WL is kept at the negative potential Vn in the non-selected state, while it is Vcc in the selected state. At this time, since there is P channel MOS transistor 204, application of a high electric field to the gate oxide film of transistor 202 in the non-selected state can be prevented. Further, since the potential level of the non-selected word line is at a negative potential, dynamic refresh characteristic of the memory cell can be improved.

Figure 5:
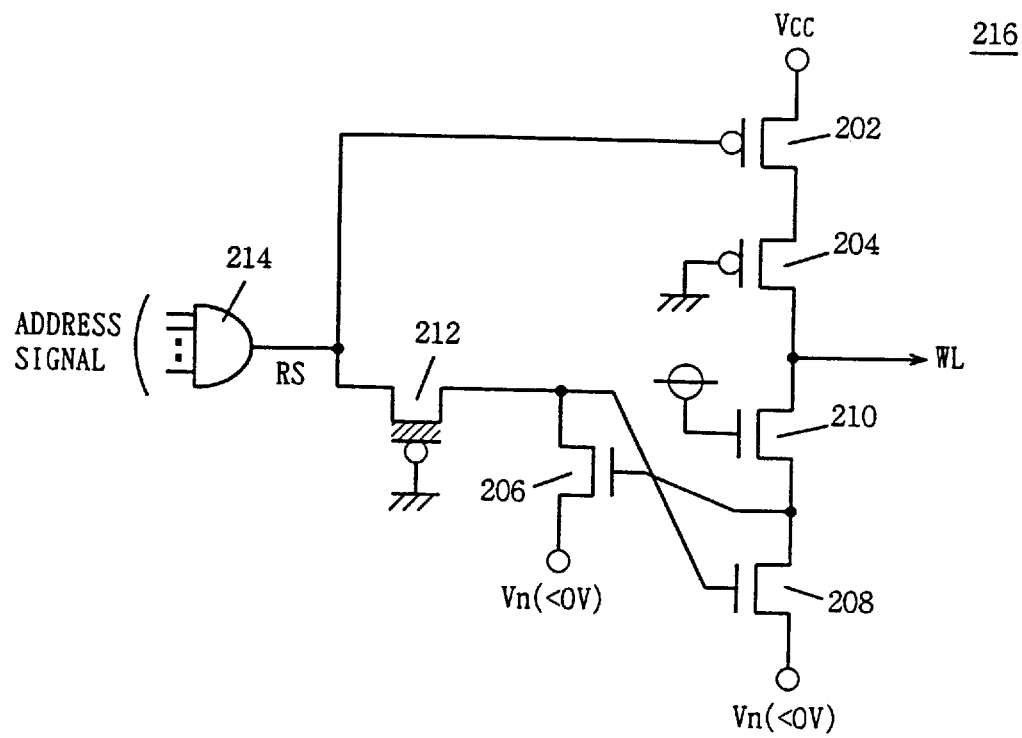
FIG. 5 is a schematic block diagram showing a modification of a potential setting circuit 200.

FIG. 5 is a schematic diagram showing a structure of potential setting circuit 216, which is a modification of potential setting circuit 200 shown in FIG. 4.

Different from potential setting circuit 200 shown in FIG. 4, an N channel MOS transistor 210 with its gate potential fixed at Vcc is inserted between the word line and the gate of N channel MOS transistor 206.

In the structure of potential setting circuit 200 shown in FIG. 4, when the word line WL is selected, the gate potential of transistor 206 is Vcc and the source potential is negative potential, Vn. Therefore, a high electric field is applied to the gate oxide film of transistor 206. In potential setting circuit 216 shown in FIG. 5, because of N channel MOS transistor 210, it is possible to prevent application of high electric field to the gate oxide film of transistor 206 while the word line is selected.

More specifically, since the gate potential of N channel MOS transistor 210 is fixed at the potential Vcc, a potential lower than the potential Vcc by the threshold voltage Vthn of transistor 210 is applied to the gate of N channel MOS transistor 206 while the potential level of the word line is at the "H" level potential, that is, Vcc.

Accordingly, the potential difference applied to the gate oxide film of transistor 206 can be reduced from Vcc+|Vn| to Vcc−Vthn+|Vn|.

Meanwhile, when the word line WL is not selected, transistor 208 is rendered conductive, and the source potential of transistor 210 lowers to the negative potential Vn. The negative potential Vn is directly transmitted to word line WL.

Therefore, in the structure of potential setting circuit 216, transistors do not receive a high electric field at their gate oxide films no matter whether the corresponding word line WL is selected or not selected. Accordingly, reliability of these transistors can be improved.

Figure 6:
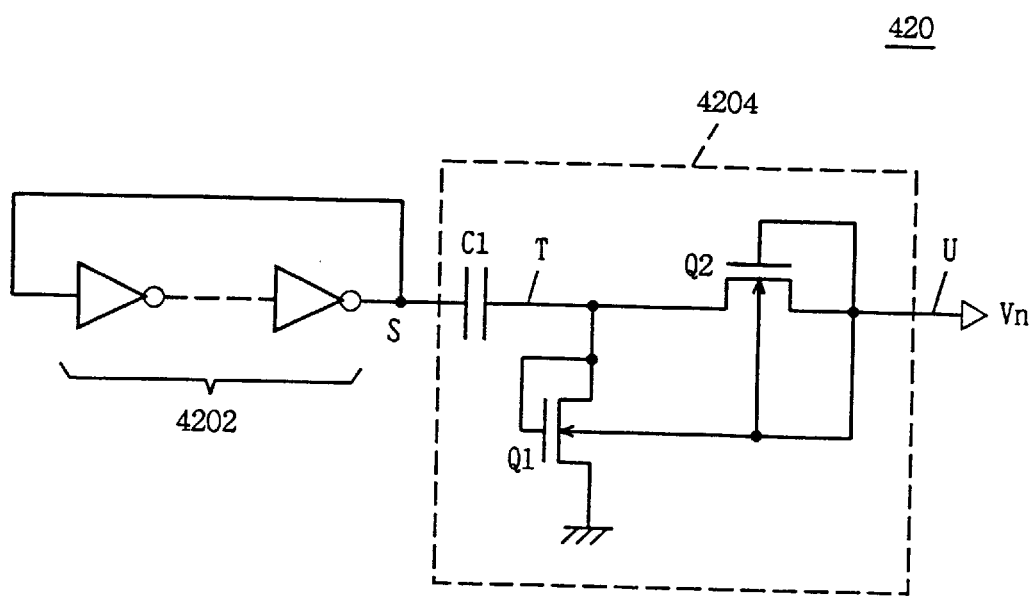
FIG. 6 is a schematic block diagram showing a structure of a negative potential generating circuit 420.

FIG. 6 is a schematic diagram showing a structure of a negative potential generating circuit 420 for supplying the negative potential Vn to potential setting circuit 200 or 216 shown in FIG. 4 or 5.

The negative potential generating circuit may also be used as a substrate potential generating circuit for generating a substrate potential for transistors constituting the memory cell array in system chip 1000, or the negative potential generating circuit and the substrate potential generating circuit may be provided as independent two different circuits.

When these circuits are provided independent from each other, there is an advantage that influence of power supply noise of negative potential level from other circuit to the negative potential supplied to the word line driver is reduced.

Negative potential generating circuit 420 includes a self-excited oscillator (ring oscillator) 4202, and a charge pump circuit 4204. The charge pump circuit includes an MOS capacitance C1 and rectifying transistors Q1 and Q2.

When an output node S of ring oscillator circuit 4202 rises with an amplitude of Vcc, the potential of a node T which is capacitively coupled to node S rises to Vcc for a moment. However, because of the rise in potential, transistor Q1 is rendered conductive, and the potential of node T is discharged with a certain time constant to the threshold voltage Vt1 of transistor Q1. Accordingly, transistor Q1 turns off. At this time, the gate and the source (substrate SUB) of transistor Q2 are connected and at the same potential. Therefore, transistor Q2 is off.

Then, when node S lowers from Vcc to 0 V, the voltage at node T lowers to a negative voltage −Vcc+Ct1 for a moment. Therefore, transistor Q1 turns off and transistor Q2 turns on. Accordingly, node B is charged to the potential −Vt2 (where Vt2 is the threshold voltage of transistor Q2). Consequently, charges equivalent to the charged amount are introduced to an output node U, so that its potential assumes a slightly negative value. Such charge pump operation is repeated and potential is supplied to an output node until the potential of output node U eventually attains to −Vcc+Vt1+Vt2.

Figure 7:
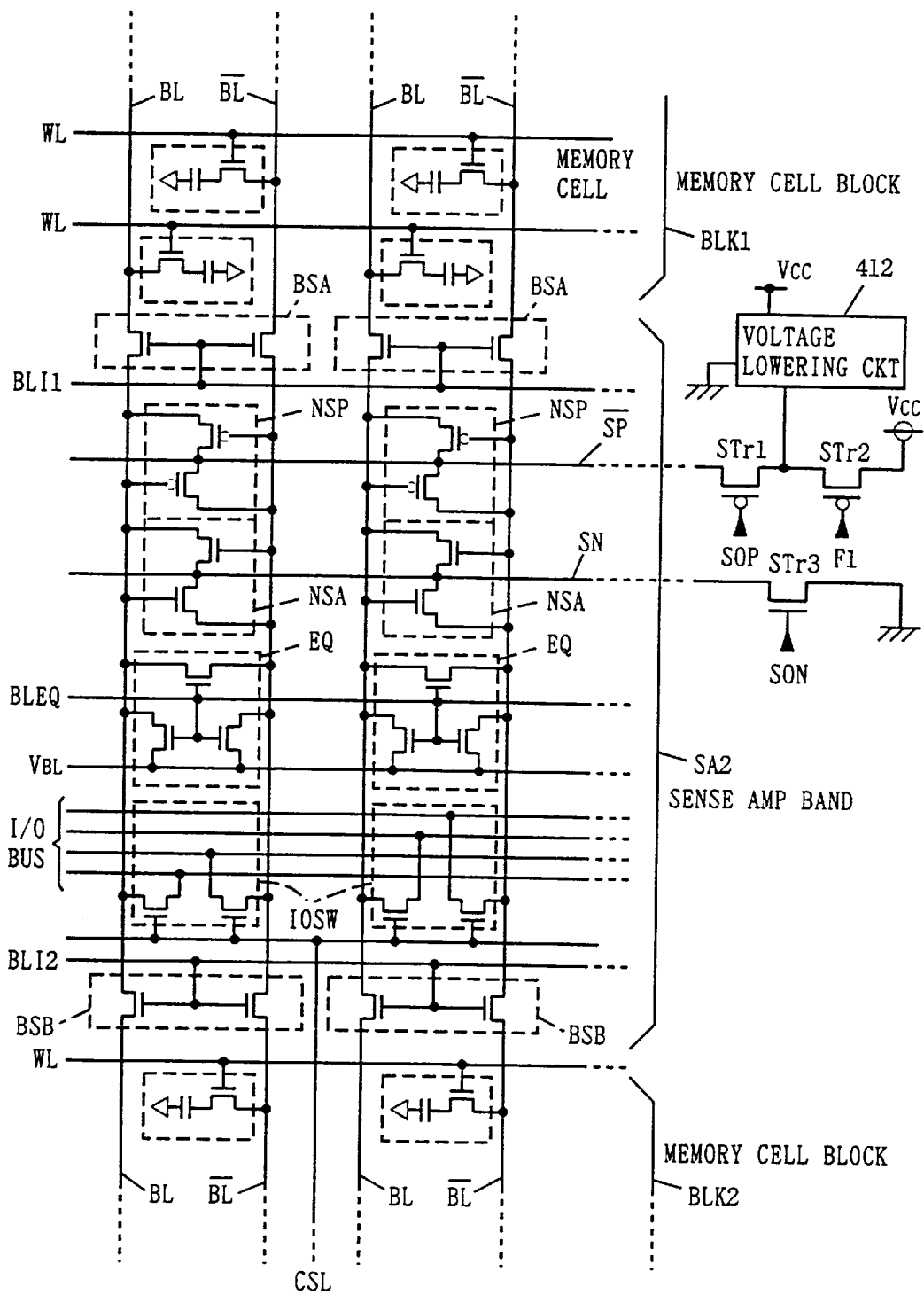
FIG. 7 is a partially enlarged diagram of boosted voltage circuit 412, switch circuit SW and the memory cell array portion in FIG. 1.

FIG. 7 is a circuit diagram showing, in enlargement, main portions of memory cell array block BLK1, sense amplifier band SA2 and memory cell array block BLK2 shown in FIG. 3. Power supply voltage Vcc generally tends to lower as the degree of integration of the circuitry increases. The lower power supply voltage leads to lower current drivability of the sense amplifier, for example.

In the example shown in FIG. 7, in the initial state of amplifying operation of the sense amplifier, the sense amplifier is directly driven by the external power supply voltage Vcc, and after the lapse of a prescribed period, it is driven by a lowered potential Vccs supplied from voltage converting circuit 412, as will be described in the following.

FIG. 7 shows memory cell array blocks BLK1 and BLK2 of dynamic RAMs, sense amplifier band SA2 and a sense amplifier driving circuit, which include word lines WL, bit line pairs BL, /BL, memory cells MC, transfer gates BSA and BSB for shared sense amplifiers, control signals BL1 and BLK2 therefor, a P channel sense amplifier PSA, a drive line /SP for the P channel sense amplifier, an N channel sense amplifier NSA, a drive line SN for the n channel sense amplifier, a bit line equalizing circuit EQ, and equalizing control circuit BLEQ, and a switching circuit IOSW for the I/O bus.

Further, there is provided a voltage converting circuit 412 for supplying an internal power supply voltage Vcc to the drive line /SP of p channel sense amplifier. Connection between the drive line SP for the p channel sense amplifier and voltage converting circuit 412 is established through p channel MOS transistor STR1. The gate of transistor STR1 receives a p channel sense amplifier activating signal SOP. Meanwhile, drive line /SP for the p channel sense amplifier is connected to the external power supply potential Vcc through a p channel MOS transistor STR2. The gate of transistor STR2 receives a signal F1.

Meanwhile, drive line SN for the N channel sense amplifier is coupled to the ground potential through an n channel MOS transistor STR3. The gate of transistor STR3 receives an n channel sense amplifier activating signal SON.

As will be described later, in the initial state of the sense amplifier operation, transistors STR1, STR2 and STR3 are all rendered conductive, so that power supply potential Vcc is supplied to p channel sense amplifier PSA and the ground potential GND is supplied to n channel sense amplifier NSA.

After the lapse of a prescribed time period, the signal F1 is rendered inactive ("H" level), transistor STR2 is rendered non-conductive, and internal power supply potential Vccs is supplied to p channel sense amplifier PSA through transistor STR1.

Meanwhile, as shown in FIG. 3, when memory cell array block BLK2 is selected, transfer gate BSB is conductive and transfer gate BSA is non-conductive. In other words, the signal BLI2 controlling transfer gate BSB is at the "H" level, that is, the power supply potential Vcc, while the signal BLI2 is at the ground potential GND.

As will be described in the following, the "H" level supplied to the memory cells is the internal power supply voltage Vccs output from voltage converting circuit 412 which is lower by a prescribed value than the external power supply voltage Vcc. Therefore, it is not necessary that the signal BLI2 is at a potential boosted from external power supply voltage Vcc.

More specifically, even when the active level ("H" level) of the signal BLI2 is at the potential Vcc and there is a voltage loss of the threshold voltage Vthn where Vthn is the threshold value of n channel MOS transistor constituting transfer gate BSB, the influence of the voltage loss does not appear provided that the internal power supply voltage supplied to the memory cells is sufficiently low. More specifically, if the difference between the external power supply voltage Vcc and internal power supply voltage Vccs is not smaller than the threshold voltage Vthn, the external power supply voltage Vcc is sufficient for the active level of signals BLI1 and BLI2 controlling transfer gate BSB and the like.

Therefore, as shown in FIGS. 1 and 7, in system chip 1000 in accordance with the first embodiment, the potential level output from word line driver for selecting the word line and the active level of the signals controlling transfer gate BSA, BSB and so on may be set to the external power supply voltage Vcc. In other words, it is not necessary to provide a boosting circuit in system chip 1000.

Even if it is necessary to set the value of external power supply voltage Vcc low, sufficient current drivability of sense amplifier can be ensured as the sense amplifier is driven directly by the external power supply potential and not the internal power supply potential at the initial stage of sense amplifier operation.

Figure 8:
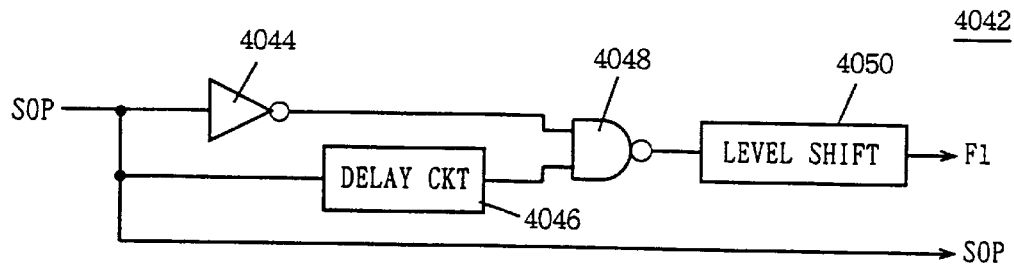
FIG. 8 is a schematic block diagram showing a structure of a control signal generating circuit for the switch circuit SW.

FIG. 8 is a schematic block diagram showing an example of a circuit outputting the signals SOP and F1 shown in FIG. 7.

A p channel sense amplifier activating signal generating circuit 4042 includes an inverter 4044 receiving the signal SOP; a delay circuit 4046 receiving the signal SOP; an NAND circuit 4048 receiving an output from inverter 4044 and an output from delay circuit 4046; and a level shift circuit 4050 receiving an output from NAND circuit 4048 for converting the potential level from the internal power supply voltage to the external power supply voltage.

When the signal SOP is inactive ("H" level), the output signal from inverter 4044 is at the "L" level, and input levels to NAND circuit 4048 are "L" and "H" levels.

Accordingly, "H" level, that is, internal power supply voltage Vccs is output from NAND circuit 4048. Level shift circuit 4050 receives the potential at the output level Vccs, converts it to the power supply voltage Vcc, and outputs it as the signal F1.

Accordingly, while the signal SOP is at the inactive state of "H" level, transistors STR1 and STR2 shown in FIG. 7 are both shut off.

When the signal SOP lowers to the active state of "L" level, the output from inverter 4044 attains to the "H" level. Meanwhile, the output from delay circuit 4046 is kept at the "H" level until the delay time τ of the delay circuit passes. Accordingly, the output level from NAND circuit 4048 changes to the "L" level. Accordingly, the signals F1 and SOP both attain to the active state of "L" level.

Accordingly, the potential level of drive line /SP for the p channel sense amplifier is pulled up to the power supply voltage Vcc.

After the lapse of delay time τ of delay circuit 4046, the output level of delay circuit 4046 also changes to the "L" level, the output level of NAND circuit 4048 attains to the "H" level in response, and the signal F1 attains to the potential Vcc. Therefore, transistor STR2 is turned off. Therefore, from this time on, internal power supply voltage Vccs supplied from voltage converting circuit 412 is supplied to the drive line /SP for the p channel sense amplifier.

Figure 9:
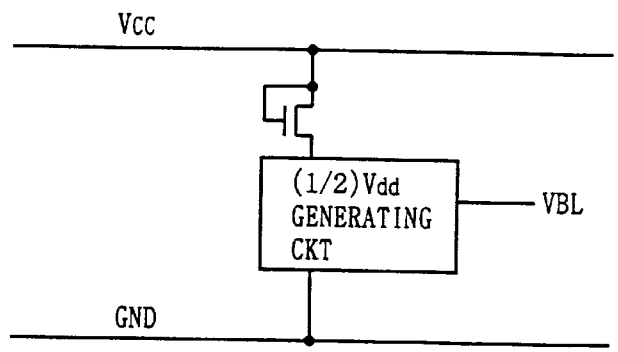
FIG. 9 is a schematic block diagram showing a structure of a bit line equalizing potential generating circuit.

The structure of the equalizing potential generating circuit for supplying an equalizing potential VBL to the equalize circuit EQ shown in FIG. 7 will be described. FIG. 9 is a schematic block diagram showing the structure of such equalizing potential generating circuit.

As already described, the "H" level of the bit line potential rises only to the value lower than the external power supply potential Vcc by the threshold value Vthn of the n channel MOS transistor of the transfer gate.

Therefore, it is necessary that the potential output from the equalizing potential generating circuit outputting the equalize level of the bit line is not the intermediate value between the power supply potential Vcc and ground potential GND, but the potential level of (Vcc−Vthn)/2.

In the equalizing potential generating circuit shown in FIG. 9, the conventional (½)Vdd generating circuit is driven by the potential level lower than the power supply potential Vcc by the threshold voltage Vthn and the ground potential GND, and the potential (Vcc−Vthn)/2 is obtained as the equalizing potential.

Figure 10:
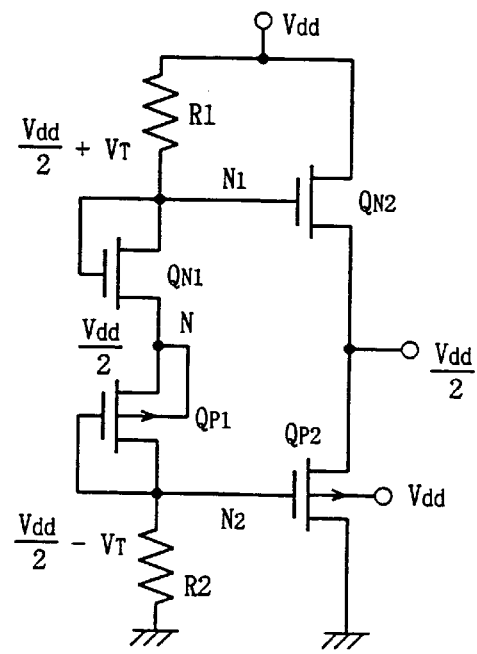
FIG. 10 is a schematic diagram showing a structure of a (½)Vdd generating circuit.

FIG. 10 is a schematic diagram showing an example of the structure of the (½)Vdd generating circuit shown in FIG. 9. The (½)Vdd generating circuit shown in FIG. 10 includes a bias stage and a push pull output stage. The bias stage includes a resistance R1, an n channel MOS transistor QN1, a p channel MOS transistor QP1 and a resistance R2 connected in series between the potential Vdd and ground potential. Transistors QN1 and QP1 are both diode connected, and transistor QP1 is adapted such that the substrate potential is equal to the potential level of node N between transistors QN1 and QP1.

Therefore, if the resistance value of the bias stage is sufficiently large, the voltage at node N would be Vdd/2. Here, assuming that all the transistors have the same threshold voltage $V_T$ respectively, the voltages at nodes N1 and N2 are (Vdd/2)+$V_T$ and (Vdd/2)−$V_T$, and therefore the output voltage of the bias stage is stabilized at Vdd/2.

Meanwhile, the push pull output stage includes an n channel MOS transistor QN2 and a p channel MOS transistor QP2 connected in series between the potential Vdd and ground potential GND. Transistor QN2 has its gate connected to the gate of transistor QN1 of the bias stage, that is, node N1, while transistor QP2 has its gate connected to the gate of transistor QP1 of the bias stage, that is, node N2.

As already described, the voltages at nodes N1 and N2 are (Vdd/2)+$V_T$ and (Vdd/2)−$V_T$, respectively. Therefore, the source-gate voltage of these two output transistors QN2 and QP2 are both VT. Accordingly, a small through current continuously flows through these two output transistors.

Accordingly, even when the output voltage Vdd/2 tends to fluctuate, either of the transistors in the output stage is rendered conductive, suppressing the fluctuation. Namely, by the structure of the equalizing potential generating circuit shown in FIGS. 9 and 10, the potential Vdd/2=(Vcc−Vthn)/2 can be stably supplied to the equalizing circuit EQ.

By driving the gate of the transmission gate transistor (n channel MOS transistor) selecting the block of the memory cell arrays with the power supply potential Vcc, it becomes possible to precharge the potential level of the bit line pair to the level of the central value between "H" level and "L" level even when there is a voltage drop corresponding to the threshold voltage of the transmission gate transistor. Therefore, it is possible to define a signal charge amount as a voltage of one electrode of a memory cell capacitor and to stably supply the equalizing level VBL which is used as a reference for detecting a signal, as the data line voltage at the time of precharging.

Further, in the DRAM operation, it becomes unnecessary to apply a boosted potential to drive any of the word lines and transmission gate transistors. Therefore, even if the transistors constituting the system chip all have the common gate oxide film thickness, reliability is not degraded, while high speed operation can be realized.

Figure 11:
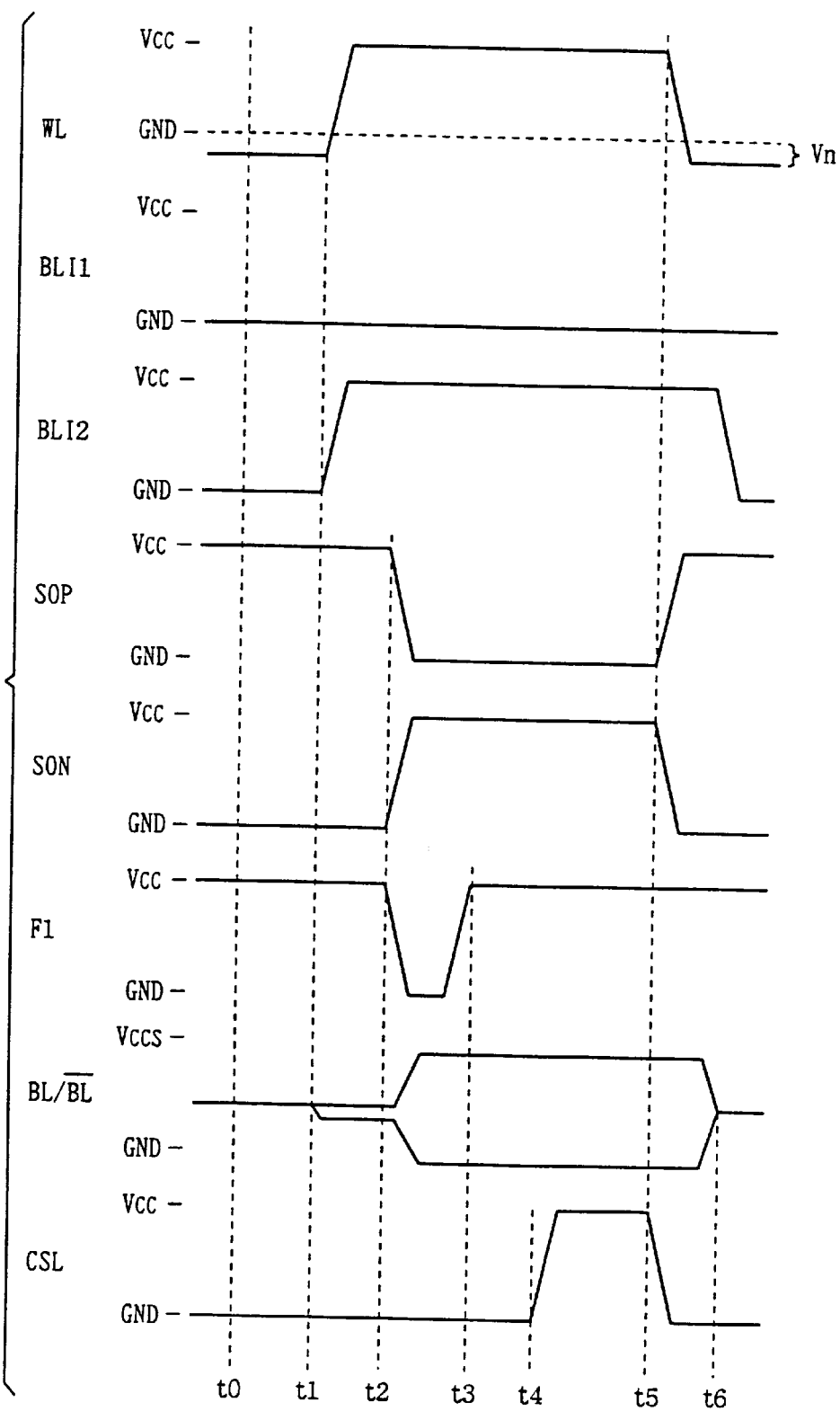
FIG. 11 is a timing chart showing the operation of system chip 1000 in accordance with the first embodiment.

FIG. 11 is a timing chart showing the operation of the DRAM of FIG. 7 described so far.

It is assumed that at time t0, the DRAM is at a standby state, the potential level of the word line WL is kept at the negative potential Vn, signals BLI1 and BLI2 controlling transmission gates BSA and BAB are both at the "L" level and memory cell blocks are not selected. Signals SOP and FI are both at the "H" level, neither the power supply potential Vcc nor the internal power supply potential Vccs is supplied to the driver line for the p channel sense amplifier, the signal SON is also at the "L" level and the driver line SN for the n channel sense amplifier is at a floating state. Assume that at this time the bit line pair is precharged to the bit line equalizing level VBL=(Vcc−Vthn)/2, supplied from the equalizing potential generating circuit shown in FIG. 9.

At time t1, in response to an external address signal, potential level of the corresponding word line WL rises from the potential Vn to the "H" level (potential level Vcc). Meanwhile, in order to connect the selected memory cell block and the sense amplifier band SA2, control signal BLI2 for the transmission gate BSB rises to the "H" level. Meanwhile, in response to the rise of the potential level of word line WL to the "H" level, the potential level of the bit line pair BL, /BL changes from the precharge potential VBL in accordance with the data stored in the memory cell.

At time t2, signals SOP and F1 both change to the active state ("L" level), and signal SON also changes to the active state ("H" level). In response, transistors STR1 to STR3 are all rendered conductive, whereby the supply of the power supply potential Vcc to the p channel sense amplifiers NSP and ground potential GND to the n channel sense amplifier NSA starts. In response, the potential level of the bit line pair is also amplified by the sense amplifier NSP and NSA, and the potential difference is amplified in accordance with the data stored in the selected memory cell.

At time t3, after the lapse of delay time τ of delay circuit 4046 shown in FIG. 8 from time t2, signal F1 starts to change to the inactive state ("H" level). In response, transistor STR2 turns off, and supply of the internal power supply potential Vccs output from voltage converting circuit 412 starts, instead of the power supply potential Vcc, to p channel sense amplifier NSP.

Meanwhile, as the potential level supplied to the sense amplifiers attain to Vccs and GND, the potential difference of the bit line pair is amplified until one potential level attains to the internal power supply potential Vccs and the other potential attains to the ground potential GND, in accordance with the information stored in the selected memory cell.

Thereafter, at time t3, in accordance with the column selection signal CSL from column decoder 414, switching circuit IOSW of the selected column of memory cells is rendered conductive, so that the amplified potential level of the bit line pair is transmitted to the corresponding I/O bus, and information stored in the selected memory cell is output to the outside of the DRAM.

At time t5, the potential level of the word line begins to fall to the potential Vn of the standby state again, and sense amplifier activating signals SOP and SON both start to change to the inactive state. Further, column selection signal CSL attains to the inactive state ("L" level), and connection between the selected bit line pair and the I/O bus is cut off.

At time t6, bit line equalizing circuit EQ is again activated, and potential level of the bit line pair changes to the bit line equalizing level VBL. Further, transmission gate control signal BLI2 attains to the inactive state, and connection between the sense amplifier and the memory cell block is cut off.

As described above, in the DRAM shown in FIG. 7, in the initial stage where sense amplifier starts to amplify potential difference between the bit line pair, the sense amplifier operates using the power supply potential Vcc and ground potential GND as operational power supply potentials. Therefore, sufficient current drivability is attained. Thereafter, the sense amplifier continues amplifying operation using the internal power supply potential Vccs and ground potential GND as operational potentials. Accordingly, the potential level of the bit line pair, that is, re-writing potential to the memory cell, would be the internal power supply potential Vccs and ground potential GND. Therefore, even for highly miniaturized memory cell transistors, operation with sufficient merging with respect to the breakdown strength is ensured.

In the example of FIG. 11, it is assumed that the potential level of the non-selected word line is a negative potential (potential level Vn). However, the present invention is not limited thereto. It is possible to ensure sufficient current drivability of the sense amplifier even when the "L" level supplied to the word line driver 408 is the ground potential GND, for example, in the system chip 1000 shown in FIG. 1.

[Second Embodiment]

In the first embodiment, a case where potential difference between the external power supply potential Vcc and the internal power supply potential Vccs supplied by the voltage converting circuit 412 in system chip 1000 becomes larger than the threshold voltage Vthn of the memory cell transistors in the memory cell array have been described. More specifically, in such a case, the potential of the active state potential level of the word line driver ("H" level) may be the external power supply potential Vcc.

However, when the potential difference between the external power supply potential Vcc and internal power supply potential Vcc does not satisfy the above described condition, it becomes necessary that the potential level when the word line driver is active is set to the potential Vpp which is boosted from the external power supply potential Vcc, so as to eliminate influence of voltage drop of the threshold voltage of memory cell transistors.

In system chip 1200 in accordance with the second embodiment, word line drive circuit 408 operates using an internal boosted potential Vpp provided by boosting the external power supply potential Vcc and the negative potential Vn as operational power supply potentials.

Figure 12:
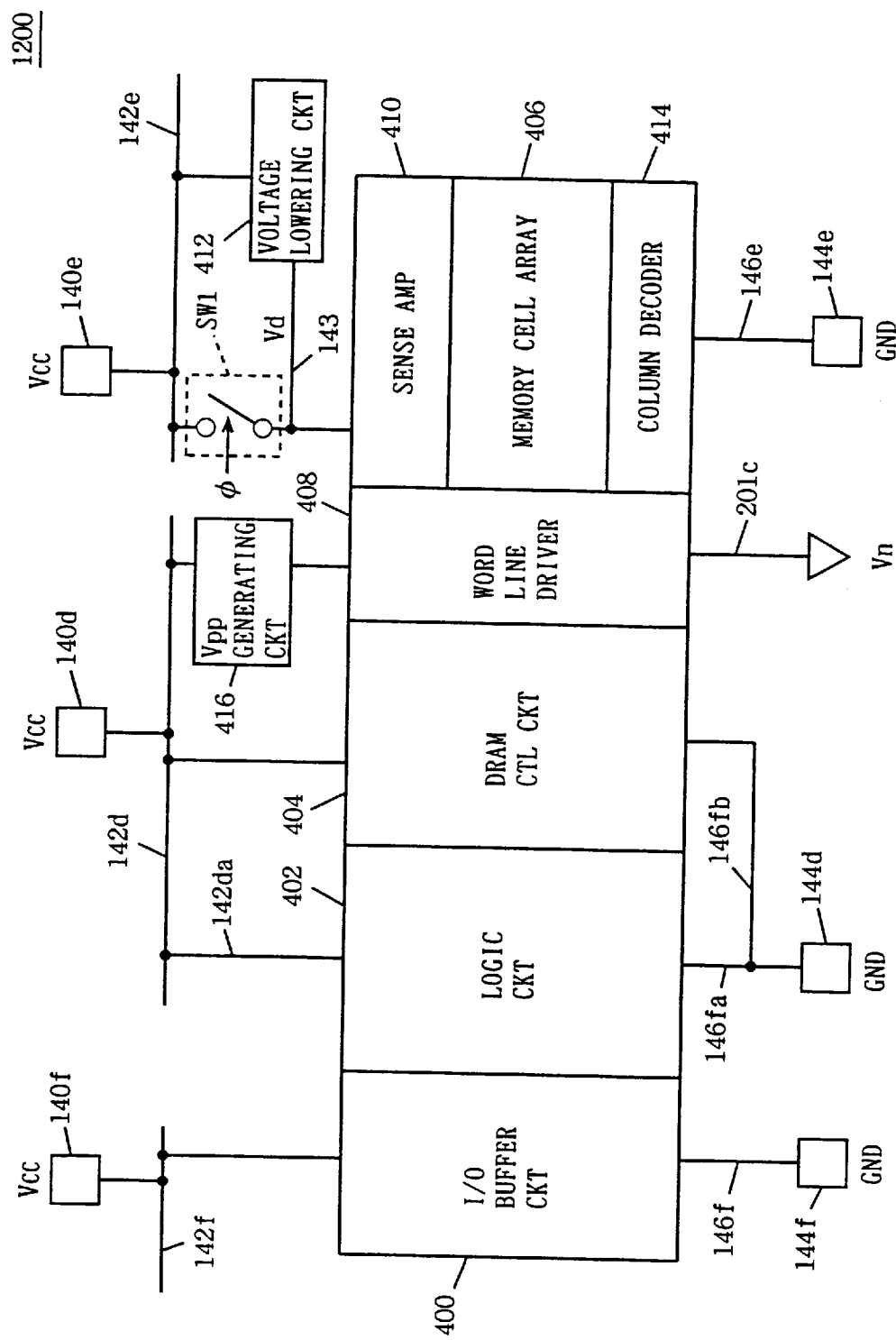
FIG. 12 is a schematic block diagram showing a structure of a system chip 1200 in accordance with a second embodiment.

FIG. 12 is a schematic block diagram showing the structure of system chip 1200.

Different from the system chip 1000 shown in FIG. 1, one operational potential of the word line driver is not the external power supply potential Vcc but the output potential from Vpp generating circuit 416 generating an internal boosted potential from external power supply potential Vcc.

Except this point, the structure is the same as that of system chip 1000 shown in FIG. 1. Therefore, corresponding portions are denoted by corresponding reference characters, and description thereof is not repeated.

Figure 13:
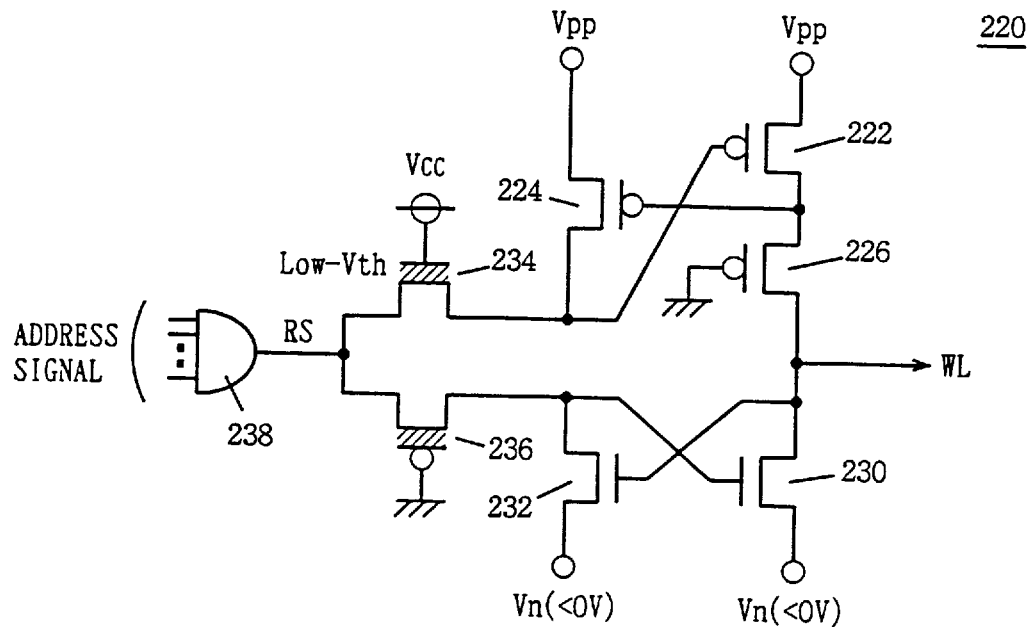
FIG. 13 is a schematic diagram showing a structure of potential setting circuit 220 in accordance with a second embodiment.

FIG. 13 is a schematic diagram showing the structure of potential setting circuit 220 for the word line potential included in the word line driver circuit 408 of FIG. 12, which corresponds to the potential setting circuit 200 shown in FIG. 4.

Potential setting circuit 220 includes a pair of p channel MOS transistors 222 and 224 receiving at their sources the internal boosted potential Vpp and having their gates and drains connected to each other; a p channel MOS transistor 226 connected between the drain of p channel MOS transistor 222 and the corresponding word line WL and having its gate potential fixed at the ground potential GND; a decode circuit 238 responsive to an externally applied address signal for setting, when the corresponding word line WL is selected, a row selection signal RS to the active state ("L" level); and an n channel MOS transistor 234 connected between the output node of decode circuit 238 and the drain of p channel MOS transistor 224 and having its gate potential fixed at the power supply potential Vcc.

The potential setting circuit 220 further includes a pair of n channel MOS transistors 230 and 232 receiving at their sources the negative potential Vn and having gates and drains connected to each other, and a p channel MOS transistor 236 connected between the drain of n channel MOS transistor 232 and the output node of decoder circuit 238 and having its gate potential fixed at the ground potential GND. The drain of n channel MOS transistor 230 is connected to the corresponding word line.

The operation of the potential setting circuit 220 will be briefly described in the following.

First, assume that the word line WL is not selected and the row selection signal RS is inactive ("H" level). At this time, potential Vcc is applied to the gate of p channel MOS transistor 222, and the transistor is cut off. Meanwhile, potential Vcc is applied to the gate of n channel MOS transistor 230, so that transistor 230 is rendered conductive and potential Vn is supplied to the word line WL.

At this time, since p channel MOS transistor 226 is conductive, gate potential level of p channel MOS transistor 224 lowers, and the transistor is rendered conductive. Accordingly, internal boosted potential Vpp is applied to n channel MOS transistor 234 through p channel MOS transistor 224. However, since the gate potential of transistor 234 is fixed at the power supply potential Vcc, the internal boosted potential Vpp is not transmitted to the side of decoder 238.

Further, in this state, since there is p channel MOS transistor 226, when the potential WL attains to a negative potential, transistor 226 is cut off, and the drain of the p channel MOS transistor 222 is set to the floating state (the potential level is about the threshold voltage Vthp of the transistor 226). Accordingly, the potential difference between the gate and the source of p channel MOS transistor 224 would be Vpp−Vthp.

By contrast, if there is not the p channel MOS transistor 226, the potential level of Vn of the word line WL which is not selected is directly applied to the gate of p channel MOS transistor 224. Accordingly, potential difference Vpp+|Vn| would be applied between the source and the gate of the transistor 224.

Accordingly, because of the existence of p channel MOS transistor 226, it becomes possible to reduce potential difference applied to the gate oxide film of p channel MOS transistor 224 in the standby state, whereby reliability of the transistor can be improved.

Meanwhile, when the word line WL is selected and the row selection signal RS attains to the active state ("L" level), the gate potential of n channel MOS transistor 230 lowers, and the transistor is cut off. Here, the gate potential of p channel MOS transistor 222 lowers so that transistor 222 is rendered conductive, and internal boosted potential Vpp is supplied to word line WL through p channel MOS transistors 222 and 226.

The p channel MOS transistors 222 and 224 having their gates and drains connected to each other constitute a half latch circuit, which circuit has a function of maintaining the potential level of the selected word line potential, Vpp.

Meanwhile, as the word line potential level attains to Vpp, n channel MOS transistor 232 is rendered conductive, and negative potential Vn is applied through transistor 232 to transistor 236. However, since the gate potential of this transistor is fixed at the ground potential GND, the negative potential Vn is not transmitted to decoder circuit 238.

As described above, since the potential level of the word line WL can be set to the internal boosted potential Vpp when selected and to negative potential Vn when not selected, the influence of voltage drop corresponding to the threshold voltage of the memory cell transistors can be eliminated, and in addition, generation of leak current through the memory cell transistors in the standby state can be suppressed.

Further, since there are n channel MOS transistor 234 and p channel MOS transistor 236, it becomes possible to prevent internal boosted potential Vpp or negative potential Vn from being transmitted to decoder circuit 238.

Figure 14:
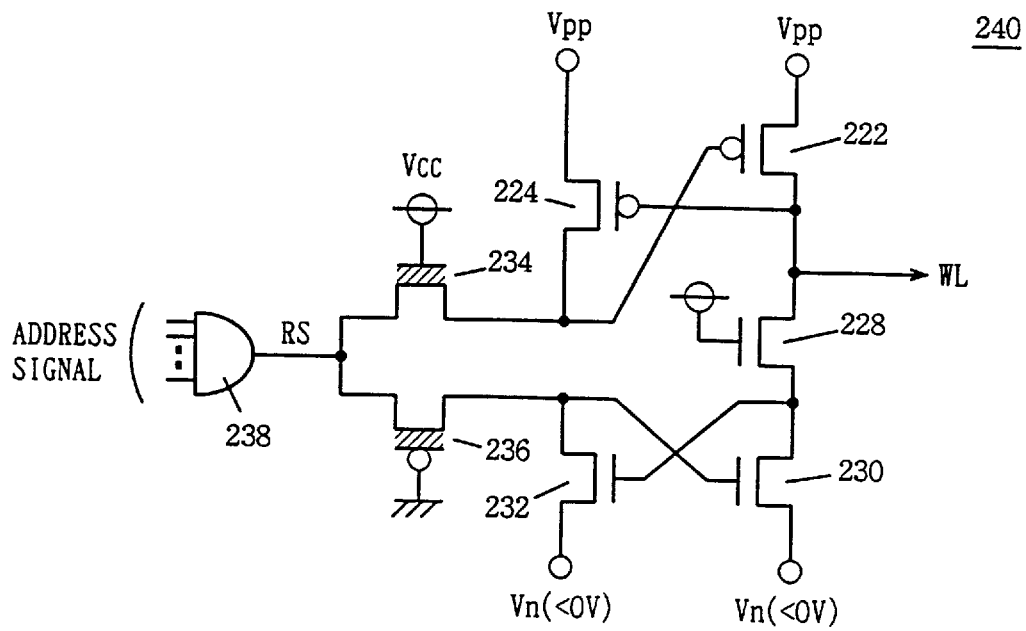
FIG. 14 is a schematic diagram showing a modification of potential setting circuit 220.

FIG. 14 is a schematic diagram showing a structure of a potential setting circuit 240 which is a modification of potential setting circuit 220 shown in FIG. 13.

Different from the structure of potential setting circuit 220 shown in FIG. 13, in this structure, instead of p channel MOS transistor 226 connected between the word line and p channel MOS transistor 222, an n channel MOS transistor 228 having its gate potential fixed at the power supply potential Vcc is provided between n channel MOS transistor 230 and the word line WL.

Since there is transistor 228, even when word line WL is selected and its potential level is at Vpp, potential difference applied between the gate and the source of transistor 232 can be reduced.

More specifically, when the word line WL is selected, the potential level Vpp is applied through transistor 228 to the gate of n channel MOS transistor 232. In this case, gate potential of transistor 228 is fixed at the power supply potential Vcc. Accordingly, the gate node of n channel MOS transistor 232 is at the floating state (of which potential level is Vcc−Vthn, where Vthn is the threshold voltage of n channel MOS transistor 228). Accordingly, potential difference between the gate and the source of transistor 232 would be Vcc−Vthn+|Vn|.

By contrast, when there is not n channel MOS transistor 228, the potential level Vpp of the word line would be directly applied to the gate of n channel MOS transistor 232, and therefore the potential difference between the gate and the source of transistor 232 would be Vpp+|Vn|.

More specifically, as there is n channel MOS transistor 228, potential difference applied between the gate and the source of transistor 232 when word line WL is selected is reduced, so that reliability of the gate oxide film of transistor 232 can be improved.

Figure 15:
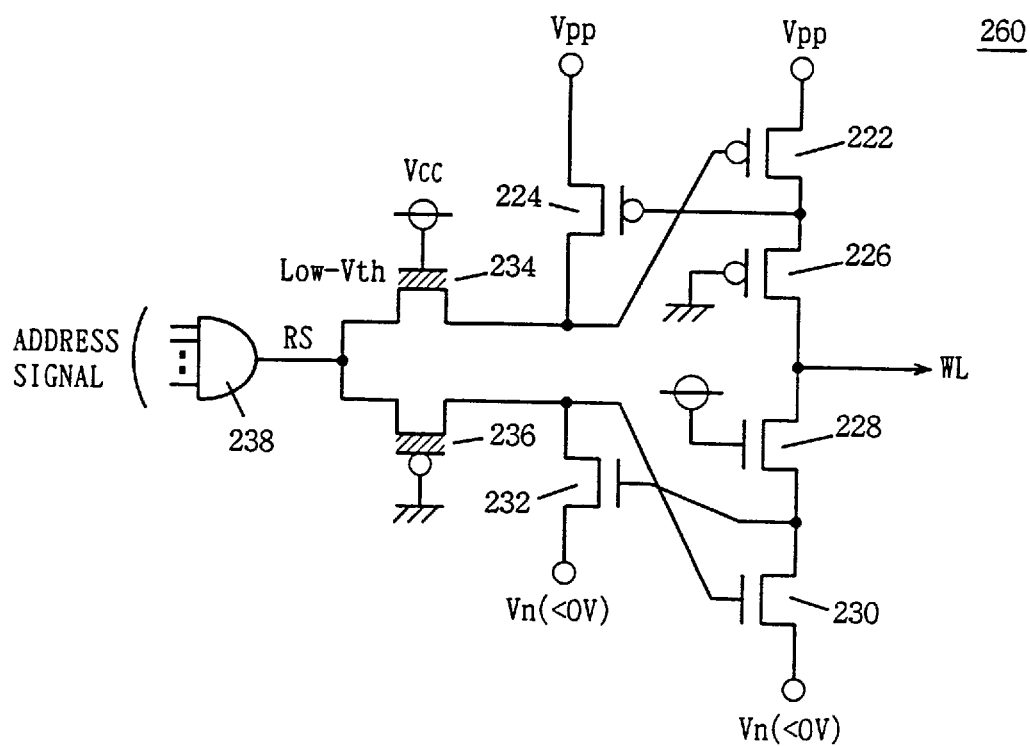
FIG. 15 is a schematic diagram showing another modification of potential setting circuit 220.

FIG. 15 is a schematic diagram showing a structure of a potential setting circuit 260 which is another modification of potential setting circuit 220 shown in FIG. 13.

Different from potential setting circuit 220, an n channel MOS transistor 228 of which gate potential is fixed at power supply potential Vcc is inserted between word line WL and n channel MOS transistor 230.

Therefore, the structure of potential setting circuit 260 shown in FIG. 15 corresponds to the combination of potential setting circuit 220 shown in FIG. 13 and potential setting circuit 240 shown in FIG. 14.

Namely, by the structure of potential setting circuit 260, no matter whether the word line WL is selected or not, the potential difference applied to the gate oxide film of MOS transistors 224 and 232 constituting the circuit can be reduced, whereby a highly reliable potential setting circuit can be realized.

[Third Embodiment]

Figure 16:
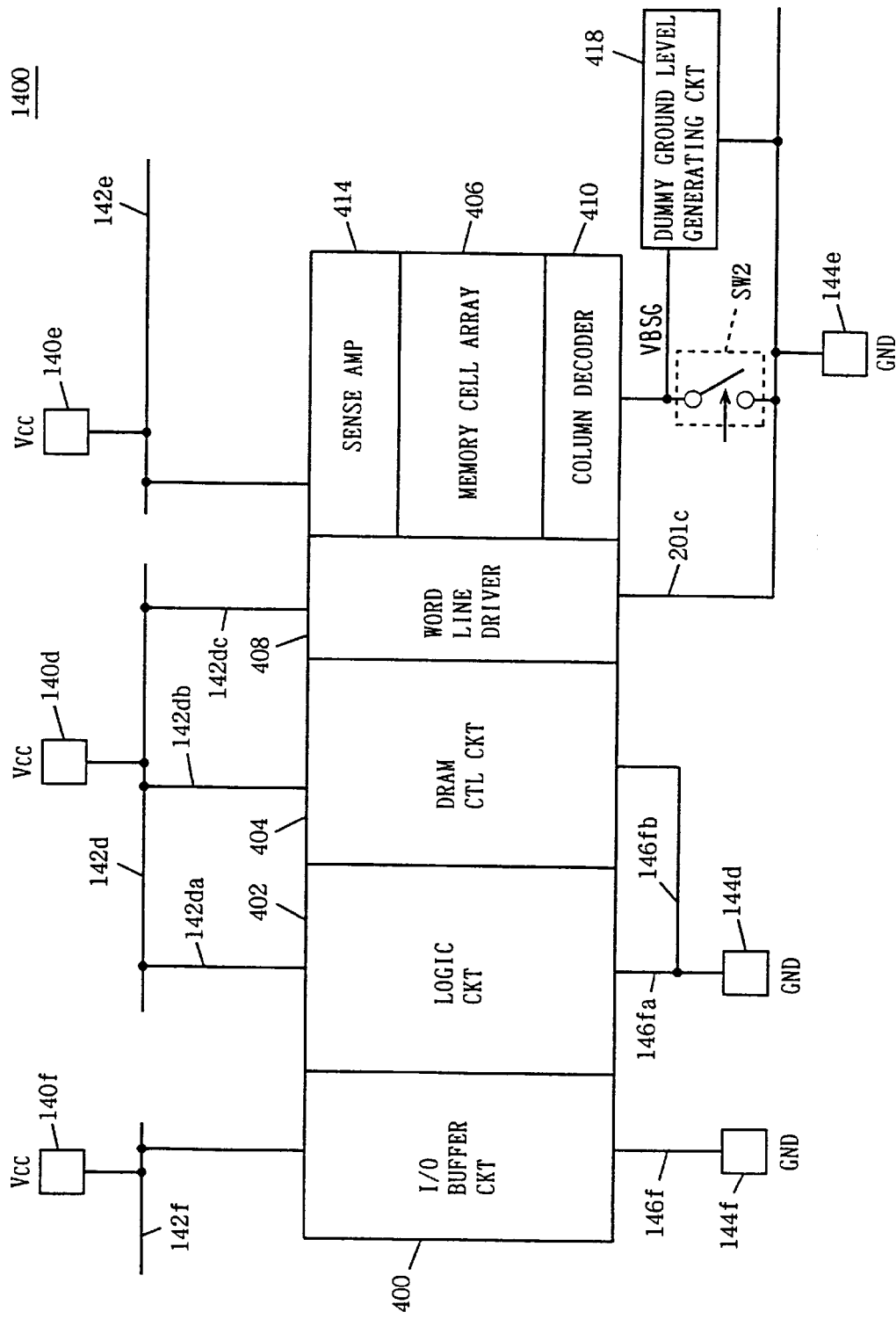
FIG. 16 is a schematic block diagram showing a structure of a system chip 1400 in accordance with a third embodiment.

FIG. 16 is a schematic block diagram showing a structure of a system chip 1000 in accordance with a third embodiment of the present invention.

The structure is different from system chip 1000 of the first embodiment in the following three points.

First, internal power supply potential Vcc is directly supplied to the sense amplifier, as an H level power supply potential. Second, ground potential GND or the potential VBSG supplied from a pseudo ground level generating circuit 418, which will be described later, is selectively supplied by switching circuit SW2 as the L level power supply potential to sense amplifier 410.

Third, the L level potential supplied to word line driver 408 is the ground potential GND.

Except these points, the structure is the same as the system chip 1000 of the first embodiment. Therefore, corresponding portions are denoted by the same reference characters and description thereof is not repeated.

As will be described later, the potential level generated from pseudo ground level generating circuit 418 is about 0.5 V, for example, which is set to he higher than be ground potential GND.

The advantage of such structure will be briefly described.

Figure 17:
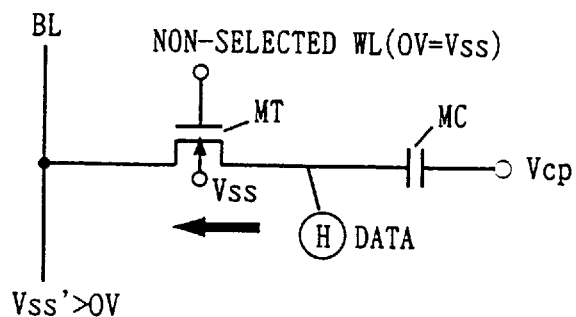
FIG. 17 is an illustration showing the effect of BSG method.
Figure 18:
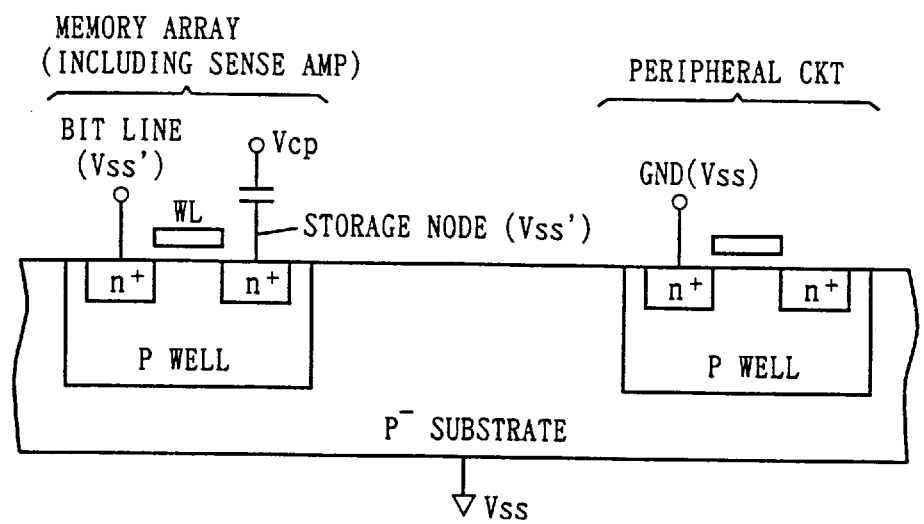
FIG. 18 is a cross sectional view showing cross sectional structure of the memory cell array and peripheral circuit portion of the third embodiment.

FIGS. 17 and 18 are illustrations showing the effect when the L level to be supplied to the sense amplifiers is set to the pseudo ground level (hereinafter represented by Vss' (hereinafter, such method will be referred to as BSG (Boosted Sense Ground) method).

There are the following four main effects.

(1) Dynamic refresh characteristic is improved

When sense amplifier performs amplifying operation, basically, the pseudo ground level Vss' is supplied. Therefore, the potential of the bit line in the selected memory cell array block is amplified to the potential Vcc or Vss'. For example, of the memory cells connected to a bit line which has the potential of the pseudo ground level Vss' (>0 V), those which are not selected have the gate potential of the memory cell transistor MT set at Vss (=0 V), as shown in FIG. 17.

Here, it is assumed that the data held in the memory cell capacitor is at the "H" level, the potential of bit line BL is Vss' >0 V, and the potential of the storage node is the "H" level of Vcc.

In this case, subthreshold current (represented by the arrow in FIG. 17) through memory cell transistor MT can be significantly reduced as compared with the case where the pseudo ground level is not used and the potentials of bit line BL and word line WL are both at 0 V.

(2) Threshold voltage VTM of memory cell transistor MT can be set low, and reliability can be improved.

As described in item (1) above, dynamic refresh characteristic can be improved, and therefore the threshold voltage VTM of memory cell transistor MT can be set lower than the prior art. Therefore, it is possible to use the external power supply potential Vcc as the "H" level potential to be applied to the selected word line. Accordingly, it becomes unnecessary to apply the boosted voltage Vpp such as described in the prior art, whereby reliability of the memory cell transistor, especially reliability of the gate oxide film can be improved.

(3) Boosted voltage generating circuit becomes unnecessary.

As described above, it is possible to directly use the external power supply voltage Vcc as the voltage to be applied to the word line. Therefore, boosted voltage generating circuit becomes unnecessary, and power consumption can be reduced.

Further, conventionally, it was necessary to set memory cell substrate or well potential to a negative voltage to cope with injection of minority carriers. In the present invention, the low level of the memory cell is the potential Vss', and the potential of the substrate (well) is the ground potential GND. Therefore, when viewed from the memory cell, the state is substantially equivalent to where a bias potential of negative voltage is supplied to the substrate.

(4) Triple well structure becomes unnecessary Generally, in the memory cell array portion, well potential is set to a negative potential of Vbb to prevent injection, and in the peripheral circuitry, well potential is set to the ground potential GND for improving performance. In that case, when a P substrate is used as the substrate, triple well structure must be adopted, which leads to increased number of process steps. However, in the present invention, in the memory cell array portion, "L" level of the bit lines and the memory cells is set to the pseudo ground level potential Vss', the well potential is set to the ground potential, while in the peripheral circuitry, both "L" level and the well potential can be set to the ground potential GND. Therefore, the aforementioned triple well structure is not always necessary, and a twin well structure such as shown in FIG. 18 may be used.

Figure 19:
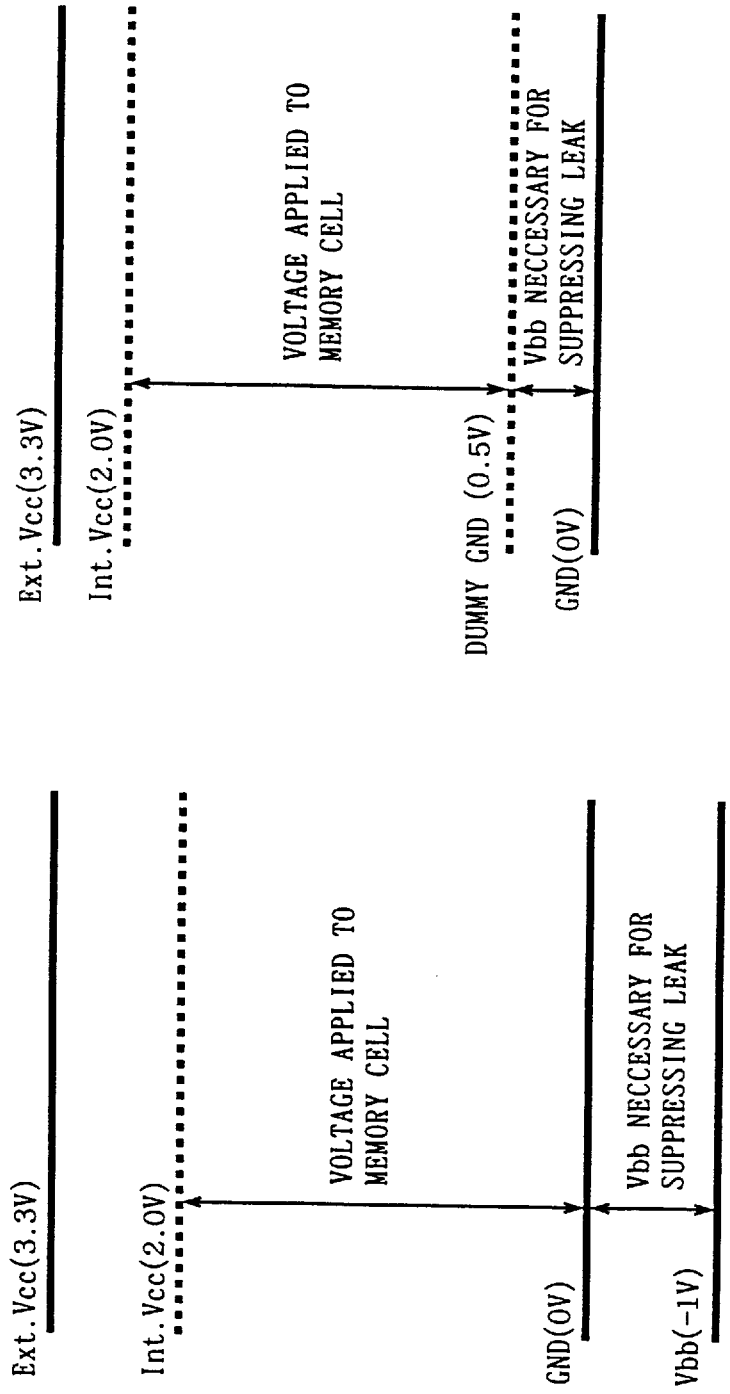
FIG. 19a shows substrate potential Vbb for suppressing leak and FIG. 19b shows pseudo ground level GND' for suppressing leak, comparing the concept of BSG method and prior art.

FIG. 19 is an illustration showing difference between the prior art example and the case where pseudo ground level is used.

In the prior art example, referring to FIG. 19a, an internal power supply voltage Vccs (for example, 2.0 V) is generated from the external power supply voltage Vcc (for example 3.3 V), and potential between the internal power supply voltage Vcc and the underground potential GND (0 V) is applied to the memory cell. Further, in the prior art example, in order to suppress subthreshold leak, it was necessary to apply a negative potential Vbb (for example, −2 V) to the memory cell, and therefore a negative potential generating circuit was indispensable.

By contrast, when the pseudo ground level is used, referring to FIG. 19b, the "L" level of the bit line amplitude is set not to the ground potential GND but to the pseudo ground level (VBSG) (for example 0.5 V) which is newly generated between the bit line precharge level and the ground potential GND. In this case, the "L level of the non-selected word line (potential GND) is relatively biased negative, with respect to the "L" level of the bit line amplitude.

Accordingly, the negative potential generating circuit is not always necessary. It goes without saying that even when pseudo ground level is used, it is possible to supply a negative potential to the memory cell to further reduce the subthreshold leak current.

FIG. 20 is a schematic block diagram showing an example of the structure of the pseudo ground level generating circuit 418 shown in FIG. 16.

The pseudo ground level generating circuit 418 includes a reference voltage generating circuit 4122 generating a voltage of approximately the same level as the pseudo ground level a differential amplifier circuit 4124 for comparing the reference voltage and the level of a pseudo ground line 4126 supplying the pseudo ground level and an n channel transistor Trn receiving the output from differential amplifier circuit 4124.

The n channel transistor Trn has its gate connected to the output of differential amplifier circuit 4124, its drain connected to the pseudo ground line 4126 and its source connected to the ground potential GND. If the level of pseudo ground line 4126 is higher than the reference voltage output from reference voltage generating circuit 4122, a signal at the "H" level is applied from differential amplifier circuit 4124 to the gate of n channel transistor Trn. In response, n channel transistor Trn is rendered conductive, and it discharges the potential of pseudo GND line 4126. Meanwhile, if the potential of pseudo ground line 4126 becomes lower than the reference potential, differential amplifier circuit 4124 stops discharging by n channel transistor Trn, so that the level of the pseudo ground line 4126 is kept at Vss' which is higher than the ground potential.

Figure 21:
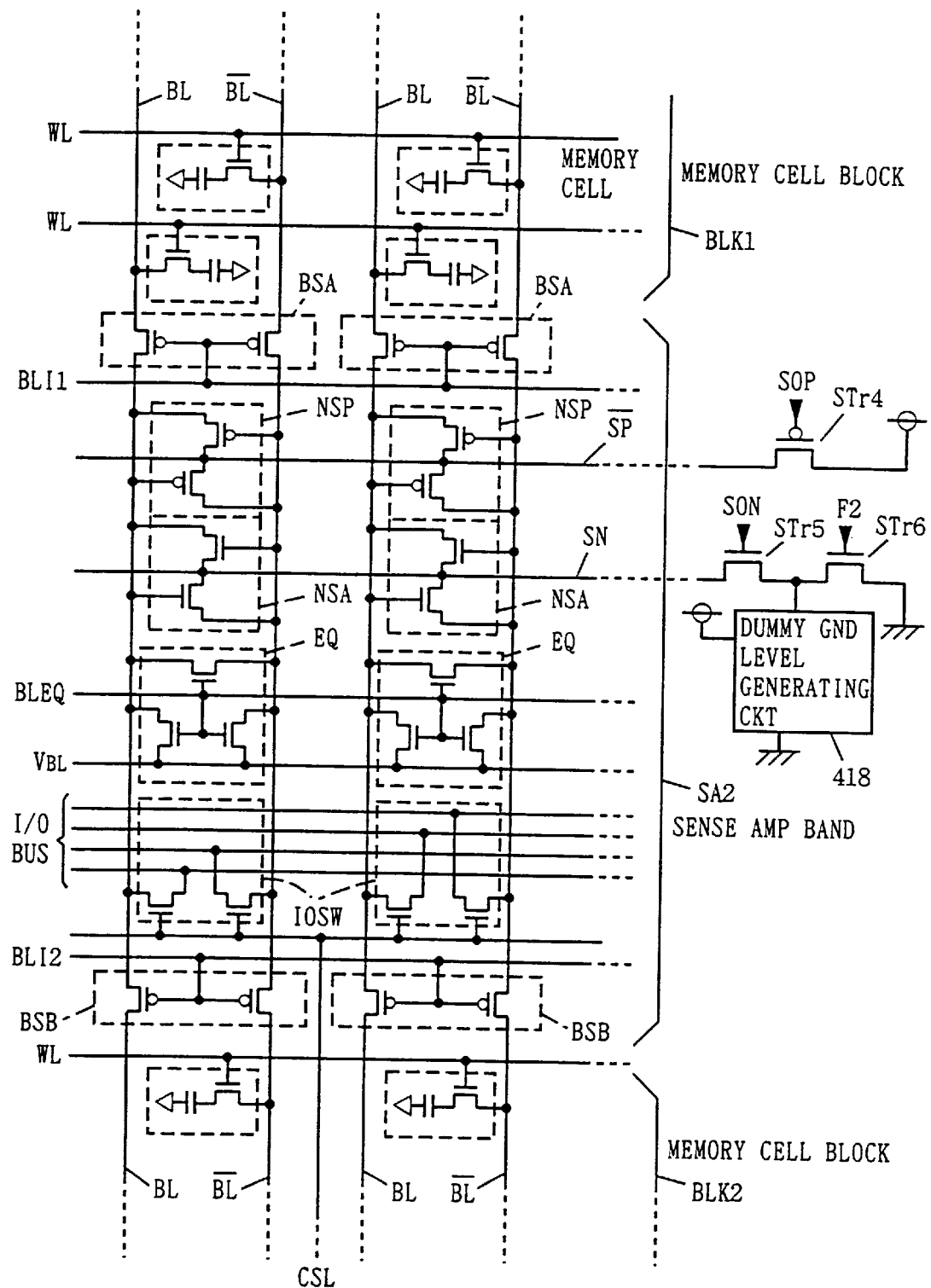
FIG. 21 is a partially enlarged view showing the pseudo ground level generating circuit 418, switching circuit SW2 and memory cell array portion 406 shown in FIG. 16.

FIG. 21 is a block diagram showing, in enlargement, structures of memory cell array 406, sense amplifier 410, pseudo ground level generating circuit 418 and switching circuit SW2 in system chip 1400 shown in FIG. 16, which corresponds to FIG. 7.

The structure differs from the first embodiment shown in FIG. 7 in the following three points.

First, to the drive line/SP for the p channel sense amplifier, power supply potential Vcc is supplied through a p channel MOS transistor STR4 controlled by signal SOP.

Second, to the drive line SN for the n channel sense amplifier, the potential VBSG from pseudo ground level generating circuit 418 is supplied through n channel MOS transistor STR5 controlled by the signal SON, and further the ground potential GND is supplied through transistor STR5 and an n channel MOS transistor STR6 controlled by the signal F2.

Third, transistors constituting transmission gates BSA and BSB are p channel MOS transistors.

Except this point, the structure is the same as that shown in FIG. 7. Therefore, corresponding portions are denoted by the same reference characters and description thereof is not repeated.

As will be described later, in the initial stage of amplifying operation by the n channel sense amplifier NSA, transistors STR5 and STR6 are both rendered conductive, and ground potential GND is supplied to the n channel sense amplifier NSA. Meanwhile, after a prescribed time period from the start of amplifying operation, only the transistor STR5 is rendered conductive, and the potential VBSG from pseudo ground level generating circuit 418 is supplied to the n channel sense amplifier NSA.

Further, as the "L" level of the bit line pair is set to the pseudo ground level VBSG, when transmission gate BSA or BSB is constituted by p channel MOS transistors, the potential level of control signal BLI1 or BLI2 for the gate at the active state ("L" level) may be the ground potential GND, in order to render conductive the transistors. More specifically, since the "L" level of the bit line pair is at the pseudo ground level VBSG which is higher than the ground potential GND, increase in potential by the threshold voltage Vthp of these transistors does not affect the reading operation even when negative potential is not applied to the gates of transmission gate transistors.

Figure 22:
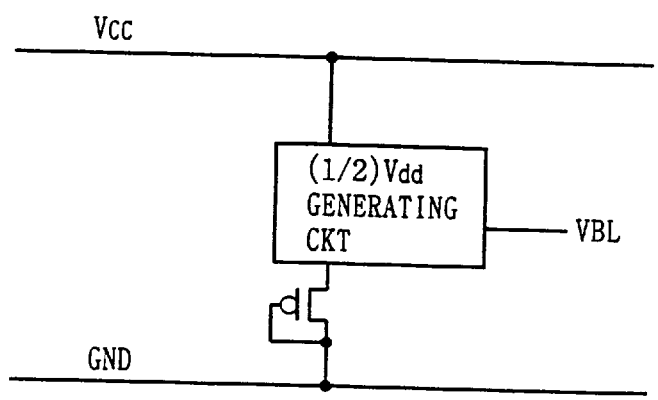
FIG. 22 is a schematic block diagram showing a structure of bit line equalizing potential VBL generating circuit.

FIG. 22 is a schematic block diagram showing a structure of the bit line equalizing level generating circuit for supplying the bit line equalizing level VBL for the bit line equalizing circuit EQ shown in FIG. 21.

As already described, the "L" level of the bit line pair BL, /BL is higher than the ground potential GND by the threshold voltage Vthp of p channel MOS transistors constituting the transmission gates. Therefore, it is not proper to use a simple intermediate value between the external power supply voltage Vcc and the ground potential GND as the bit line equalizing level.

As shown in FIG. 22, by adapting (½) Vbb generating circuit such that it operates using the external power supply voltage Vcc and the potential higher than the ground potential GND by the threshold voltage of p channel MOS transistor as operational power supply potentials, it becomes possible to output a potential level of VBL=(Vcc+Vthp)/2, as the bit line equalizing level VBL.

By such a structure, it becomes possible to define signal charge amount as the voltage of memory cell capacitor electrode, and to stably supply a bit line equalizing level which is used as a reference for signal detection, as the bit line potential at the time of precharging.

Further, it is not necessary to apply a potential difference not smaller than the difference between the power supply potential Vcc and the ground potential GND to the transistors constituting the system chip. Therefore, reliability of the system chip can be improved.

The structure of (½) Vbb generating circuit shown in FIG. 22 is basically the same as the circuit shown in FIG. 10, except that the operational power supply potentials are different.

Figure 23:
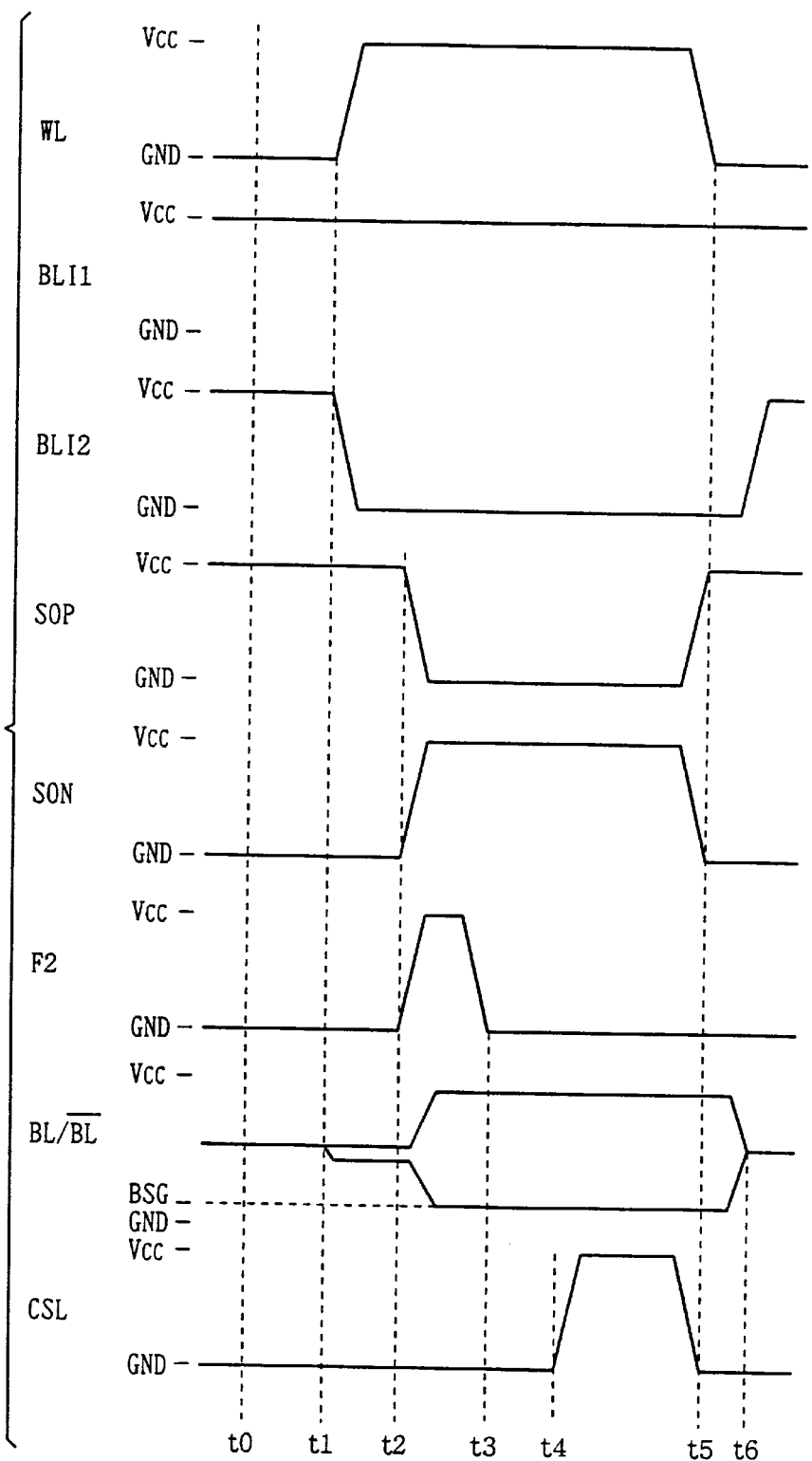
FIG. 23 is a timing chart showing the operation of the system chip in accordance with the third embodiment.

FIG. 23 is a timing chart showing data reading operation from a memory cell block of the DRAM shown in FIG. 21, which corresponds to FIG. 11.

Referring to FIGS. 21 and 23, it is assumed that at time t0, the word line WL in memory cell block BL2 is inactive (that is, potential level is at GND), and comparator signals BLI1 and BLI2 for transmission gates BSA and BSB are both inactive ("H" level). At time t0, signal SOP is also inactive ("H" level), and the signals SON and F2 are also inactive ("L" level). Meanwhile, potential levels of bit line pair BL, /BL are both at the bit line equalizing level VBL=(Vcc−Vthp)/2.

A time t1, in accordance with an external address signal, potential level of a word line WL in the selected memory cell block BL2 starts to change to the active state (where potential level is Vcc). Meanwhile, control signal BLI2 for the transmission gate BSB for connecting the selected memory cell block BL2 to the sense amplifier is changed to active state ("L" level). In response to activation of the word line, potential difference appears between the bit line pair BL, /BL in accordance with the information stored in the selected memory cell.

At time t2, signal SOP changes to the active state ("L" level), and signals SON and F2 change to the active state ("H" level). In response, sense amplifiers NSA and BSA both start amplifying operation, and therefore potential difference between the bit line pair BL, /BL is amplified.

In this state, n channel sense amplifier NSA is supplied with the ground potential GND, as transistors STR5 and STR6 are both conductive.

At time t3, in response to the signal F2 attaining to the inactive state ("L" level), pseudo ground level VBSG from pseudo ground level generating circuit 418 is supplied through transistor STR5 to n channel sense amplifier NSA. Therefore, the potential difference of the bit line pair is amplified until the potential of one of the paired bit line attains to Vcc and the other attains to VBSG.

Thereafter, at time t4, in accordance with an external column address signal, the column selection signal CSL corresponding to the selected column is set to the active state ("H" level), and the corresponding column of memory cells is connected to the I/O bus. Thus, the read data is output to the outside of the DRAM.

At time t5, column selection signal CSL attains to the inactive state. The potential of the word line and sense amplifier activating signals SOP and SON all attain to the inactive state.

Thereafter, at time t6, the pair of bit lines BL, /BL are equalized to the potential VBL, as the bit line equalizing circuit is activated.

As described above, in the initial stage of amplifying operation, the ground potential GND is directly supplied to sense amplifier NSA, and therefore the sense amplifier can exhibit sufficient current drivability. Meanwhile, the potential level of one of the paired bit lines BL and /BL which is set to the "L" level is the pseudo ground level VBSG, while the potential level of the non-selected word line is the ground potential GND. Therefore, subthreshold leak current through non-selected memory cell transistor can be suppressed. Thus the dynamic refresh characteristic of the DRAM can be improved.

[Fourth Embodiment]

Figure 24:
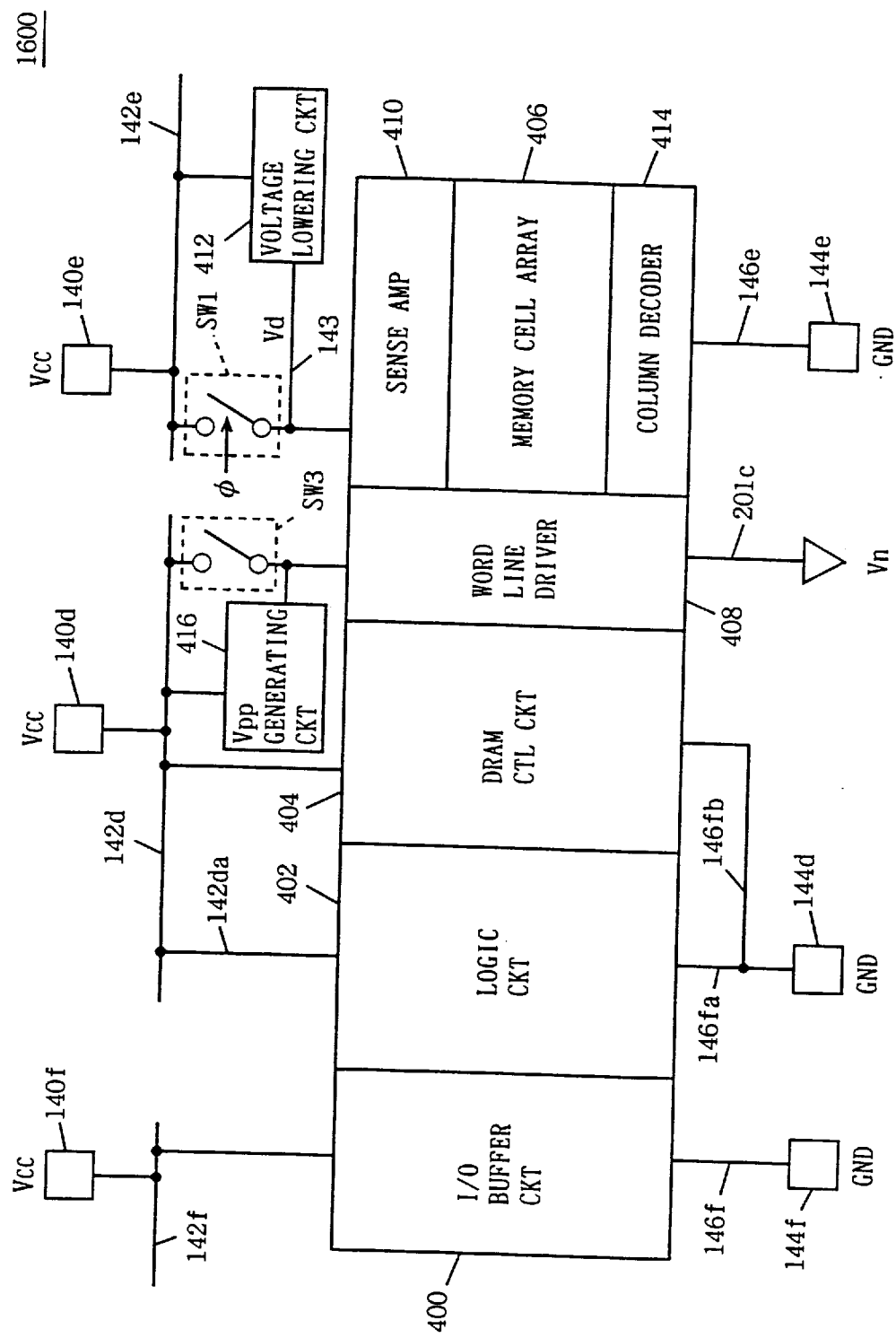
FIG. 24 is a schematic block diagram showing a structure of a system chip 1600 in accordance with the fourth embodiment.

FIG. 24 is a schematic block diagram showing a structure of a system chip 1600 in accordance with a fourth embodiment of the present invention.

In system chip 1000 in accordance with the first embodiment, the word line drive operates using external power supply potential Vcc and the negative potential Vn as operational power supply potentials.

However, assuming that the system chip is battery operated, in the initial stage of battery operation, sufficient power supply potential is supplied but as time passes, the potential level supplied by the battery lowers. Therefore, though it is possible to use the external power supply potential Vcc directly as the H level of the word line driver in the initial stage of the operation, it may not be possible to receive sufficient H level supplied from the battery as time passes.

System chip 1600 in accordance with the fourth embodiment provide a system chip which ensures supply of stable H level to the word line driver 408 even in such a case.

More specifically, the structure of system chip 1600 differs from that of system chip 1000 shown in FIG. 1 in that supply of the power supply potential to the word line driver 408 is switched by switching circuit SW3 between direct supply of external power supply potential Vcc and supply of an output potential from Vpp generating circuit 416 which generates boosted potential Vpp based on the external power supply potential Vcc.

Except this point, the structure is the same as that of system chip 1000 of the first embodiment. Therefore, corresponding portions are denoted by the same reference characters and description thereof is not repeated.

Figure 25:
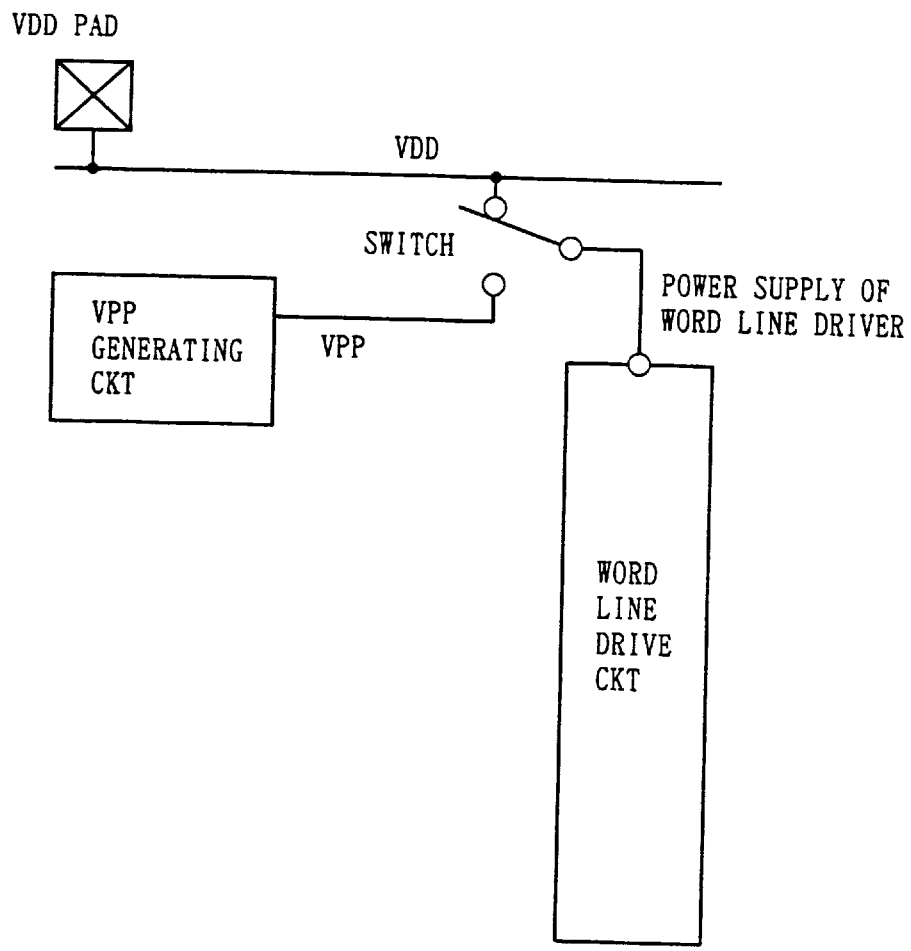
FIG. 25 is a partially enlarged view showing the structure of a word line drive circuit and Vpp generating circuit in accordance with the fifth embodiment.
Figure 26:
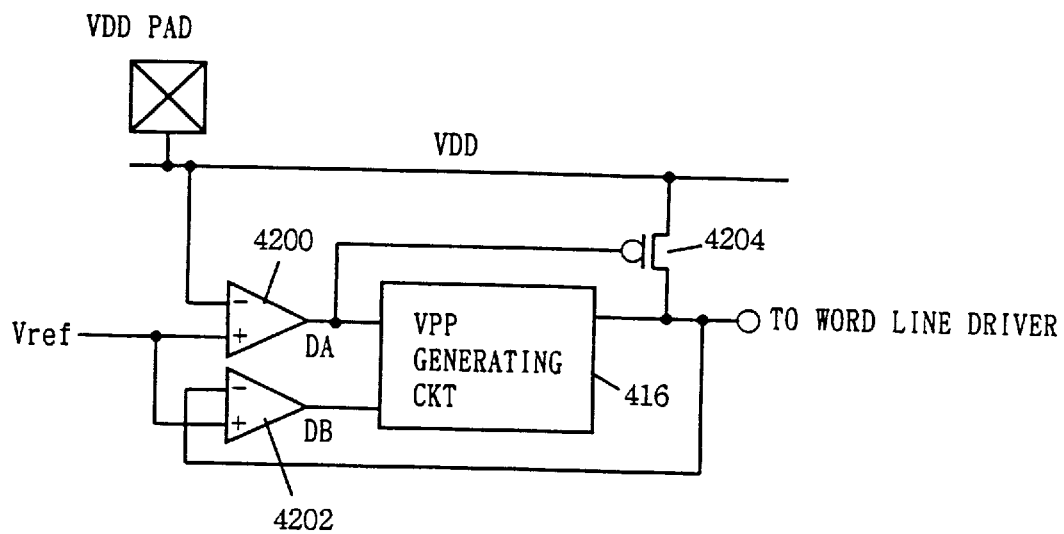
FIG. 26 is a schematic block diagram showing, in greater detail, the concept of FIG. 25.

FIG. 25 is a schematic block diagram showing a structure of a circuit for supplying the H level to the word line driver, and FIG. 26 is a block diagram showing details of the structure shown in FIG. 25.

Referring to FIG. 25, either the chip external power supply potential Vcc or the output potential Vpp from Vpp generating circuit generating a boosted potential can be selectively supplied as the power supply for the word line drive circuit at the DRAM portion.

Here, the internal boosted potential Vpp is set to be not lower than (power supply potential of the sense amplifier) +(threshold voltage Vthn of the memory cell transistor). For example, when the operational power supply potential of the sense amplifier (that is, output potential from voltage converting circuit 412) is 2.0 V and the threshold voltage Vthn of the memory cell transistor is 1.2 V, the value of the internal boosted potential Vpp is set to 3.3 V, for example.

In the circuit shown in FIG. 26, switching circuit SW3 includes a differential amplifier 4200 receiving the external power supply potential Vcc at a minus input node, and reference potential Vref (in the above example, 3.3 V) at a plus input node; a differential amplifier 4202 receiving an output from Vpp generating circuit 416 at a minus input node and reference voltage Vref at a plus input node; and a p channel MOS transistor 4204 receiving a potential at output node DA of differential amplifier 4200 at its gate, for rendering conductive or non-conductive the coupling between external power supply potential Vcc and the output node of Vpp generating circuit 416.

Figure 27:
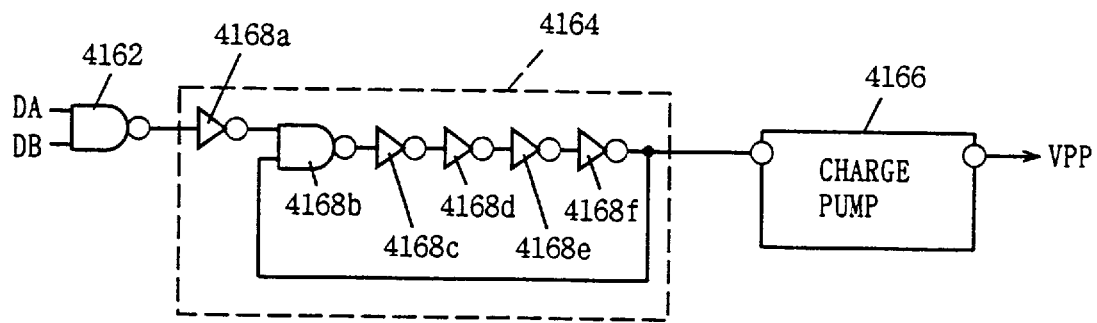
FIG. 27 is a schematic block diagram showing the structure of Vpp generating circuit 416.

FIG. 27 is a schematic block diagram showing an example of the structure of Vpp generating circuit 416 shown in FIG. 26.

Vpp generating circuit 416 includes an NAND circuit 4162 and having the input nodes connected to output node DA of differential amplifier 4200 and output node DB of differential amplifier 4202 respectively, a ring oscillator 4164 oscillating in accordance with an output signal from NAND circuit 4162, and a charge pump circuit 4166 receiving an output from ring oscillator circuit 4164 for generating a boosted potential.

Ring oscillator 4164 includes an inverter 4168a receiving an output from NAND circuit 4162, an NAND circuit 4168b receiving at one input node the output from inverter 4168a, and inverters 4168c, 4168d, 4168e and 4168f cascade connected to each other and receiving, as an input signal, the output from NAND circuit 4168b. Inverter 4168f has its output node connected to the other input node of NAND circuit 4168b and to an input of charge pump circuit 4166.

The operation of the circuit shown in FIG. 26 will be briefly described.

When the external power supply potential Vcc is higher than the reference voltage Vref, the output level of differential amplifier 4200 is at the "L" level, p channel MOS transistor 4204 is rendered conductive, and external power supply potential Vcc is supplied to the word line driver.

Meanwhile, when external power supply potential Vcc lowers and becomes lower than reference voltage Vref, the output level from differential amplifier 4200 attains to the "H" level, and p channel MOS transistor 4204 turns off.

Meanwhile, the output level of differential amplifier 4202 attains to the "H" level, and potential levels at input nodes of NAND circuit 416 shown in FIG. 27 both attain to the "H" level. In response, the output level of inverter 4168a attains to the "H" level, ring oscillator 4164 starts its operation, and internal boosted potential Vpp is supplied from Vpp generating circuit 416 to the word line driver.

Meanwhile, by the boosting operation of Vpp generating circuit, when the potential level of the output node thereof becomes higher than Vref, the output level of differential amplifier 4202 attains to the "L" level, and oscillating operation of ring oscillator stops. Therefore, potential level output from Vpp generating circuit 416 is kept approximately equal to the value of reference potential Vref.

Figure 28:
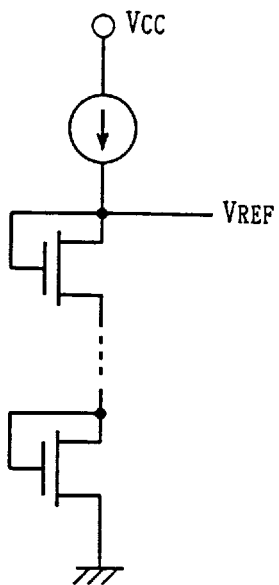
FIG. 28 is a schematic block diagram showing a structure of a reference potential generating circuit.
Figure 29:
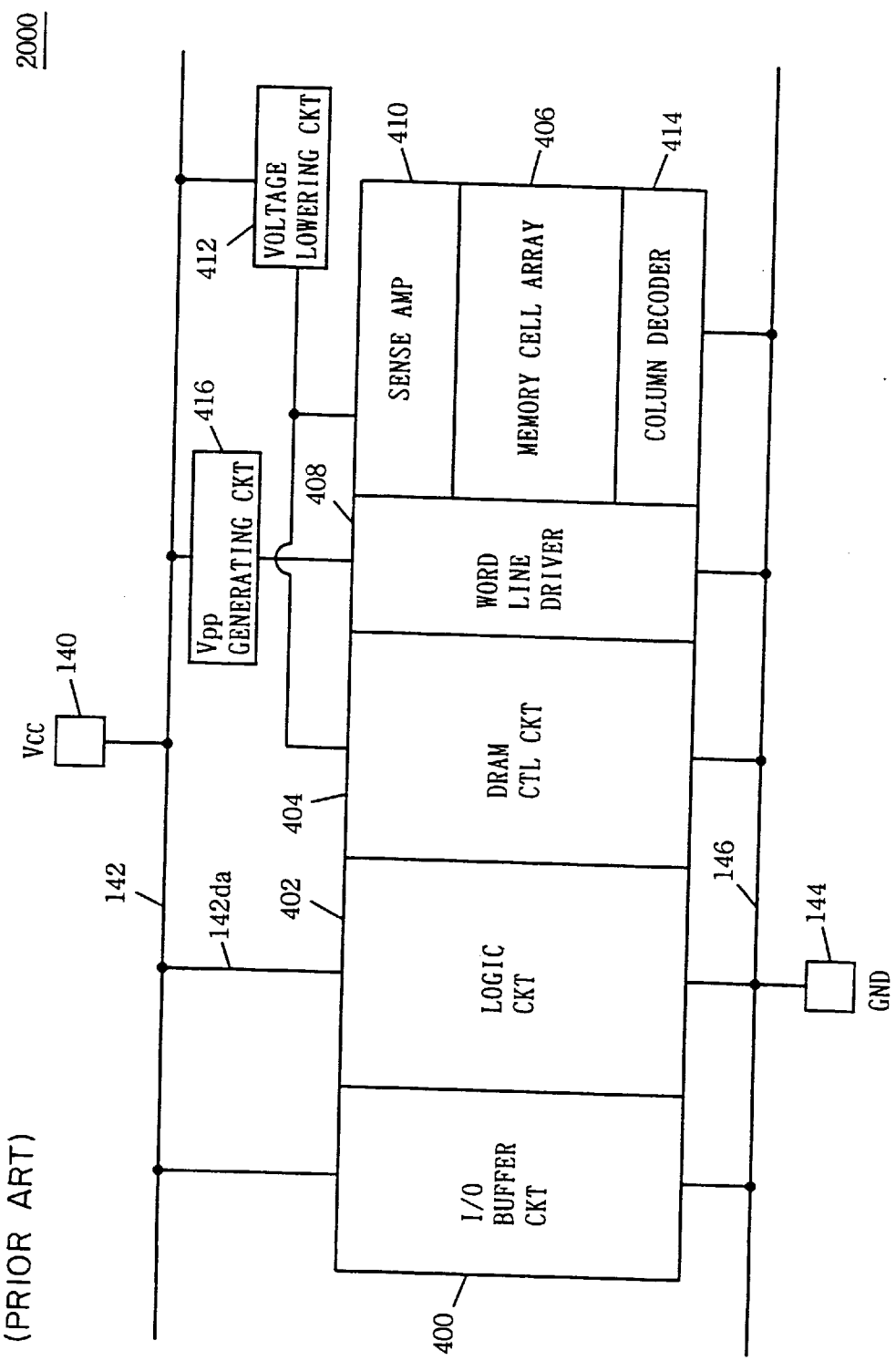
FIG. 29 is a schematic block diagram showing a structure of a conventional system chip 2000.
Figure 30:
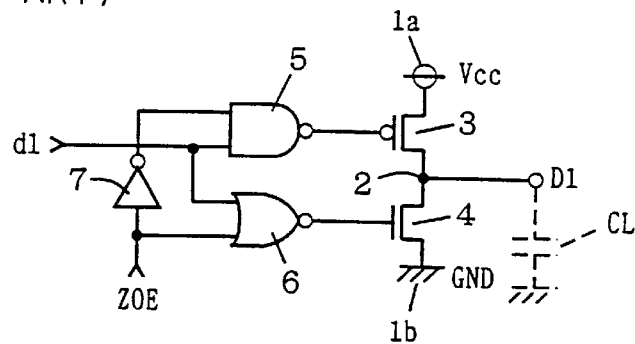
FIG. 30 shows a structure of a conventional output buffer circuit.
Figure 31:
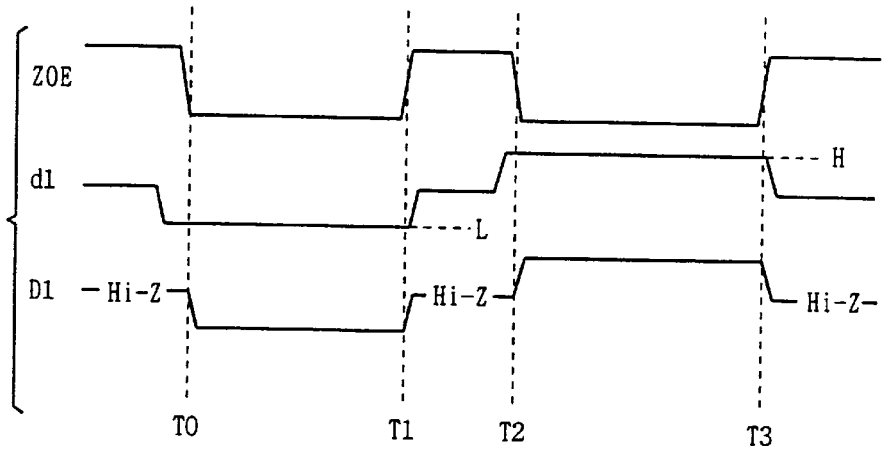
FIG. 31 is a diagram of waveforms showing the operation of a conventional output buffer circuit.
Figure 32:
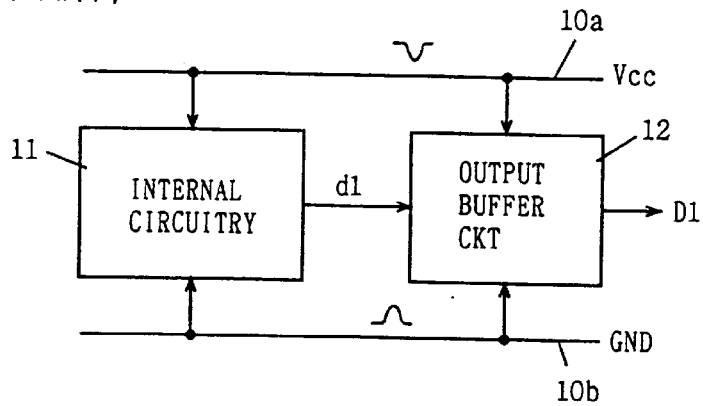
FIG. 32 shows an arrangement of power supply lines in a conventional semiconductor integrated circuit device.
Figure 33:
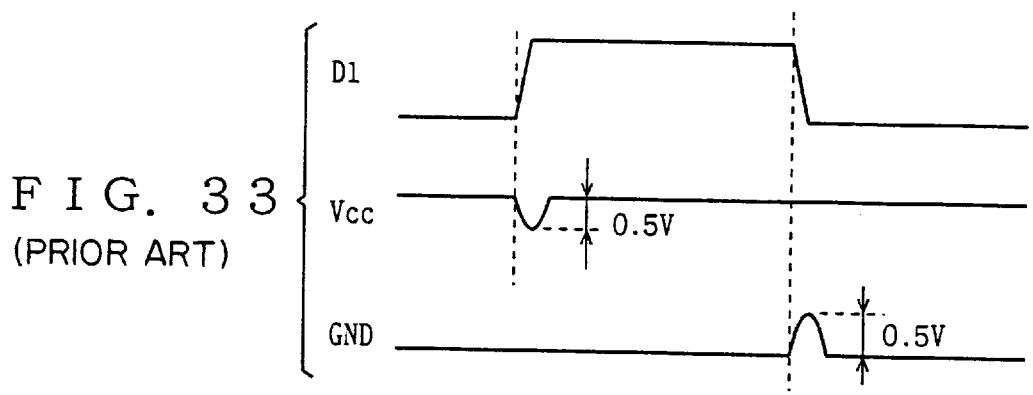
FIG. 33 shows problems of the structure shown in FIG. 32.
Figure 34:
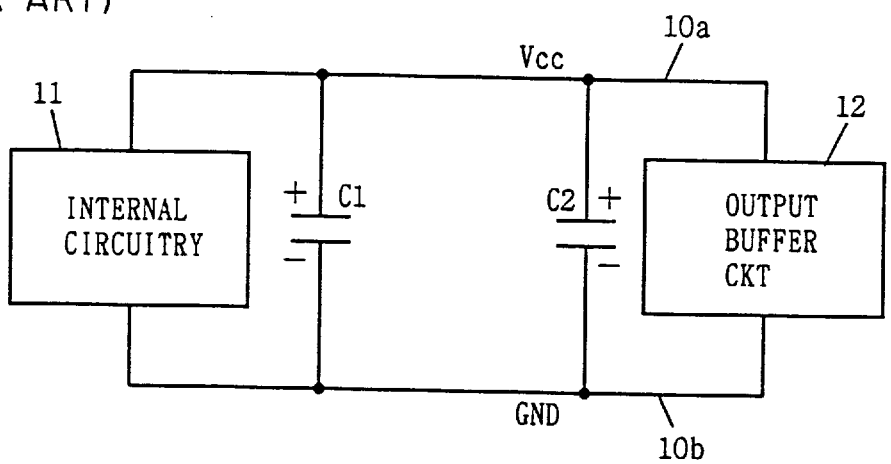
FIG. 34 shows modification of the conventional semiconductor integrated circuit device.
Figure 35:
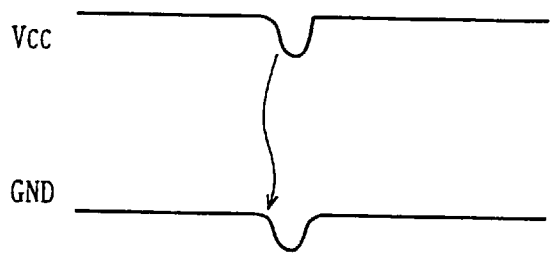
FIG. 35 shows problems of the semiconductor integrated circuit device shown in FIG. 34.

FIG. 28 shows an example of the circuit supplying the reference potential Vref shown in FIG. 26.

By connecting in series between power supply potential Vcc and the ground potential GND, from the side of the power supply potential Vcc, a constant current source and n channel MOS transistors each being diode connected, it becomes possible to take out potential level of a ground node of the n channel MOS transistor which is closest to the constant current source as the reference potential Vref.

By the above described structure, a system chip can be obtained in which speed of operation of internal circuitry is not affected even when the system chip 4600 is battery operated and the external power supply potential Vcc becomes lower than a prescribed reference potential as time passes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device operating supplied with an external first power supply potential and a second power supply potential higher than said first power supply potential, comprising:

internal voltage converting means receiving said second power supply potential for supplying an internal power supply potential between said first and second power supply potentials;

memory means for holding data, including
a plurality of memory cells arranged in a matrix of rows and columns for holding data, one of data levels to be stored corresponding to said internal power supply potential,
a plurality of word lines provided corresponding to a plurality of rows of said memory cells, respectively, and
row selecting means for selecting, by setting potential of selected said word line to said second power supply potential, a corresponding row of memory cells;

logic operation means, using said first and second power supply potentials as one and the other operational power supply potentials, for performing a prescribed logic operation on data held by said memory means and for outputting the result; and a buffer circuit operating using said first and second power supply potentials as one and the other operational power supply potentials, buffering and outputting an output signal from said logic operation means.

2. The semiconductor integrated circuit device according to claim 1, further comprising:

a first power supply line supplying said first power supply potential;
a second power supply line supplying said second power supply potential;
a third power supply line provided separate from said first power supply line, for supplying said first power supply potential;
a fourth power supply line provided separate from said second power supply line, for supplying said second power supply potential;
a fifth power supply line provided separate from said first and third power supply lines, for supplying said first power supply potential; and
a sixth power supply line provided separate from said second and fourth power supply lines, for supplying said second power supply potential; wherein
said internal voltage converting means operates using the first power supply potential on said first power supply line and the second power supply potential on said second power supply line as operational power supply potentials,
said logic operation means operates using the first power supply potential on said third power supply line and the second power supply potential on said fourth power supply line as operational power supply potentials, and
said buffer circuit operates using the first power supply potential on said fifth power supply line and the second power supply potential on said sixth power supply line as operational power supply potentials.

3. The semiconductor integrated circuit device according to claim 2, wherein
said memory means further includes
a plurality of bit line pairs provided corresponding to the columns of said memory cells, and
a plurality of sense amplifiers for amplifying potential difference generated on said bit line pairs in accordance with data held by memory cells selected by said row selecting means;
said semiconductor integrated circuit device further comprising
power supply switch means receiving said second power supply potential and said internal power supply potential, for supplying, in response to start of row selecting operation, said second power supply potential to said plurality of sense amplifiers for a prescribed period and thereafter switched for supplying said internal power supply potential.

4. The semiconductor integrated circuit device according to claim 2, further comprising:
standby potential supplying means operating using said first and second power supply potentials as one and the other operational power supply potentials, for supplying a third power supply potential corresponding to a potential of a non-selected word line, lower than said first power supply potential; wherein
said row selecting means includes a word line driving means operating using said third and said second power supply potentials as one and the other operational power supply potentials, for supplying to a corresponding word line said third power supply potential when the word line is not selected and said second power supply potential when the word line is selected, in accordance with an external address signal.

5. The semiconductor integrated circuit device according to claim 4, wherein
said word line driving means includes
a plurality of row decode means provided corresponding to said word lines for activating a row selection signal in accordance with said address signal, and
a plurality of potential setting means provided corresponding to respective ones of said row decode means for driving potentials of corresponding word lines;
each of said potential setting means includes
a P channel MOS transistor receiving at its source said second power supply potential and at its gate said row selection signal, and rendered conductive when said row selection signal is activated,
potential difference reducing means provided between said P channel MOS transistor and said corresponding word line, for setting drain potential of said P channel MOS transistor to be higher than said third power supply potential and lower than said second power supply potential while said row selection signal is inactive, and
standby potential holding means for supplying said third power supply potential to said corresponding word line while said row selection signal is inactive.

6. The semiconductor integrated circuit device according to claim 3, wherein
each of said sense amplifier is provided corresponding to a prescribed number of groups of said plurality of bit line pairs and has first and second input nodes;
said semiconductor integrated circuit device further comprising:
a pair of lines provided corresponding to each of said prescribed number of bit line pairs, for transmitting potential of a selected bit line pair to said first and second input nodes, respectively; and
a pair of N channel MOS transistors provided corresponding to each of said bit line pairs for selectively connecting and disconnecting corresponding said line pair and said bit line pair; wherein
said pair of N channel MOS transistors are rendered conductive when potential of their gates is set to said second power supply potential.

7. The semiconductor integrated circuit device according to claim 6, further comprising:
bit line equalizing potential generating means operating using said first power supply potential Vgnd and said second power supply potential Vcc as one and the other operational power supply potentials for outputting an equalizing potential (Vcc+Vgnd−Vthn)/2, where Vgnd is said first power supply potential, Vcc is said second power supply potential and Vthn is threshold by of said N channel MOS transistor; and
equalizing means provided corresponding to at least each of said sense amplifiers, responsive to a bit line equalizing signal for setting potential of a selected bit line pair and of said corresponding line pair to said equalizing potential.

8. The semiconductor integrated circuit device according to claim 1, further comprising:
pseudo ground level generating means for outputting a pseudo ground level which is higher than said first power supply potential and lower than said internal power supply voltage; wherein
said memory means further includes
a plurality of bit line pairs provided corresponding to columns of said memory cells, and
a plurality of sense amplifiers using said internal power supply voltage and said pseudo ground level as one and the other operational power supply potentials, for amplifying potential difference generated on said bit line pairs in accordance with data held in memory cells selected by said row selecting means;
said row selecting means selects the corresponding row of memory cells by setting potential of selected said word line to said second power supply potential and sets potential of not selected said word lines to said first power supply potential;
said semiconductor integrated circuit device further comprising
power supply switch means receiving said first power supply potential and said pseudo ground level responsive to start of said row selecting means, for supplying said first power supply potential to said plurality of sense amplifiers for a prescribed time period and thereafter switched for supplying said pseudo ground level wherein
potential of said non-selected word line is kept lower than the potential of said bit line pairs.

9. The semiconductor integrated circuit device according to claim 1, further comprising:
pseudo ground level generating means for outputting a pseudo ground level higher than said first power supply potential and lower than said internal power supply voltage; wherein
said memory means further includes
a plurality of bit line pairs provided corresponding to the rows of said memory cells, and
a plurality of sense amplifiers operating using said internal power supply voltage and said pseudo ground level as one and the other operational power supply potentials, for amplifying potential difference generated between said bit line pairs in accordance with data held in a memory cell selected by said row selecting means;
said row selecting means selects corresponding row of the memory cells by setting potential of selected said word line to said second power supply potential, and setting potential of not selected said word lines to said dummy line level;
each of said sense amplifiers is provided corresponding to a prescribed number of groups of said plurality of bit line pairs and having first and second input nodes,
said semiconductor integrated circuit device further comprising
line pairs provided corresponding to said prescribed number of bit line pairs, for transmitting potential of a selected bit line pair to said first and second input nodes, respectively, and
a pair of P channel MOS transistors provided corresponding to each said bit line pair for selectively connecting and disconnecting corresponding said line pair and said bit line pair; wherein
said pair of P channel MOS transistors each rendered conductive when gate potential is set to said first power supply potential, and
potential of said non-selected word line is kept lower than the potential of said bit line pair.

10. The semiconductor integrated circuit device according to claim 9, further comprising:
bit line equalizing potential generating means operating using said power supply potential Vgnd and said second power supply potential Vcc as one and the other operational power supply potentials, for outputting an equalizing potential (Vcc+Vgnd+Vthp)/2, where Vgnd is said first power supply potential, Vcc is said second power supply potential and Vthp is threshold value of said P channel MOS transistor; and
equalizing means provided corresponding to at least each said sense amplifiers, responsive to a bit line equalizing signal for setting potential of selected said bit line pair and said corresponding line pair to said equalizing potential.

11. A semiconductor integrated circuit device operating supplied with an external first power supply potential and a second power supply potential higher than said first power supply potential, comprising:
internal voltage converting means receiving said second power supply potential, for supplying an internal power supply potential between said first and second power supply potentials;
standby potential supplying means operating using said first and second power supply potentials as one and the other operational power supply potentials, for supplying a third power supply potential corresponding to a potential of a non-selected word line lower than said first power supply potential;
boosting means operating using said first and second power supply potentials as one and the other operational power supply potentials, for outputting a fourth power supply potential higher than said second power supply potential as an internal boosted potential;

memory means for holding data, including a plurality of memory cells arranged in a matrix of rows and columns, for holding data corresponding to either said first power supply potential or said internal power supply potential, a plurality of word lines provided corresponding to the rows of said plurality of memory cells, and row selecting means for selecting corresponding row of memory cells by setting potential of selected said word line to said internal boosted potential, and for holding potential of non-selected word lines at said third power supply potential;

logic operation means using said first and second power supply potentials as one and the other operational power supply potentials, for performing a prescribed logic operation on data held by said memory means and outputting the result; and a buffer circuit operating using said first and second power supply potentials as one and the other operational power supply potentials, for buffering and outputting an output signal from said logic operation means.

12. The semiconductor integrated circuit device according to claim 11, further comprising:

a first power supply line for supplying said first power supply potential;

a second power supply line for supplying said second power supply potential;

a third power supply line provided separate from said first power supply line for supplying said first power supply potential;

a fourth power supply line provided separate from said second power supply line for supplying said second power supply potential;

a fifth power supply line provided separate from said first and third power supply lines for supplying said first power supply potential; and a sixth power supply line provided separate from said second and fourth power supply lines for supplying said second power supply potential; wherein said internal voltage converting means operates using the first power supply potential on said first power supply line and the second power supply potential on said second power supply line as operational power supply potentials;

said logic operation means operates using the first power supply potential on said third power supply line and said second power supply potential on said fourth power supply line as operational power supply potentials; and said buffer circuit operates using the first power supply potential on said fifth power supply line and the second power supply potential on said sixth power supply line as operational power supply potentials.

13. The semiconductor integrated circuit device according to claim 12, wherein said row selecting means includes word line drive means operating using said third power supply potential and said internal boosted potential as one and the other operational power supply potentials, for supplying to a corresponding word line, said third power supply potential when the word line is not selected and said internal boosted potential when the word line is selected, in accordance with an external address signal;

said word line drive means includes a plurality of row decode means provided corresponding to said word lines for activating a row selection signal in accordance with said address signal, and potential setting means provide corresponding to each said row decode means for driving potential of the corresponding word line;

each of said potential setting means includes a first P channel MOS transistor receiving at its source said internal boosted potential and at its gate said row selection signal, and rendered conductive in response to activation of said row selection signal, a second P channel MOS transistor receiving at its source said internal boosted potential, and having its gate connected to the drain of said first P channel MOS transistor and its drain connected to the gate of said first P channel MOS transistor, potential difference reducing means provided between said first P channel MOS transistor and said corresponding word line, for setting drain potential of said first P channel MOS transistor to be higher than said third power supply potential and to be lower than said internal boosted potential, and standby potential holding means for supplying said third power supply potential to said corresponding word line while said row selection signal is inactive.

14. The semiconductor integrated circuit device according to claim 12, wherein said row selecting means includes word line drive means operating using said third power supply potential and said internal boosted potential as one and the other operational power supply potentials for supplying, to a corresponding word line, said third power supply potential when the word line is not selected and said internal boosted potential when said word line is selected, in accordance with an external address signal, said word line driving means including a plurality of row decode means provided corresponding to said word lines for activating a row selection signal in accordance with said address signal, and a plurality of potential setting means provided corresponding to each said row decode means for driving potential of the corresponding word line;

each of said potential setting means includes a third N channel MOS transistor receiving at its source said third power supply potential and at its gate said row selection signal, and rendered non-conductive in response to activation of said row selection signal, a fourth P channel MOS transistor receiving at its source said third power supply potential and having its gate connected to the drain of said third N channel MOS transistor and its drain connected to the gate of said third N channel MOS transistor, first potential difference reducing means provided between said third N channel MOS transistor and said corresponding word line, for setting drain potential of said third N channel MOS transistor to be higher than said third power supply potential and lower than said internal boosted potential while said row selection signal is active, and driving potential holding means for supplying said internal boosted potential to said corresponding word line while said row selection signal is active.

15. The semiconductor integrated circuit device according to claim 14, wherein said driving potential holding means includes a first P channel MOS transistor receiving at its source said internal boosted potential and at its gate said row selection signal, and rendered conductive in response to activation of said row selection signal, a second P channel MOS transistor receiving at its source said internal boosted potential, and having its gate connected to the drain of said first P channel MOS transistor and its drain connected to the gate of said first P channel MOS transistor, and second potential difference reducing means provided between said first P channel MOS transistor and said corresponding word line, for setting drain potential of said first P channel MOS transistor to be higher than said third power supply potential and lower than said internal boosted potential while said row selection signal is inactive.

16. The semiconductor integrated circuit device according to claim 11, wherein said boosting means selects and outputs as said internal boosted potential, said fourth power supply potential provided by boosting said second power supply potential when said second power supply potential is lower than a prescribed potential, and said second power supply potential when said second power supply potential is higher than the prescribed potential.

17. The semiconductor integrated circuit device according to claim 16, wherein said boosting means includes
an output node for outputting said internal boosted potential,
an internal boosting circuit operating using said first and second power supply potentials as one and the other operational power supply potentials and outputting said fourth power supply potential to said output node,
reference potential generating means for outputting said prescribed potential,
first comparing means for comparing said second power supply potential with said prescribed potential,
switch means responsive to a result of comparison by said first comparing means for coupling said second power supply potential and said output node when said second power supply potential is higher than said prescribed potential, and
second comparing means for comparing potential of said output node with said prescribed potential; and
said internal boosting circuit performs boosting operation when the potential of said output node is lower than said prescribed potential, in accordance with a result of comparison by said second comparing means.

18. A semiconductor integrated circuit device comprising:
internal voltage converting means for supplying an internal power supply potential between a first and a second power supply potentials;
memory means for holding data, including
a plurality of dynamic type memory cells arranged in a matrix of rows and columns for holding data, one of data levels to be stored corresponding to said internal power supply potential,
a plurality of word lines provided corresponding to a plurality of rows of said dynamic type memory cells, respectively, and
row selecting means for selecting, by setting potential of selected said word line to said second power supply potential, a corresponding row of dynamic type memory cells; and logic operation means, using said first and second power supply potentials, for performing a prescribed logic operation on data held by said memory means and for outputting the result.

19. The semiconductor integrated circuit device according to claim 18, wherein said memory means further includes
a plurality of bit line pairs provided corresponding to the columns of said dynamic type memory cells, and
a plurality of sense amplifiers for amplifying potential difference generated on said bit line pairs in accordance with data held by dynamic type memory cells selected by said row selecting means;

said semiconductor integrated circuit device further comprising
power supply switch means receiving said second power supply potential and said internal power supply potential, for supplying, in response to start of row selecting operation, said second power supply potential to said plurality of sense amplifiers for a prescribed period and thereafter switched for supplying said internal power supply potential.

20. The semiconductor integrated circuit device according to claim 18, further comprising:

standby potential supplying means, operating using said first and second power supply potentials, for supplying a third power supply potential corresponding to a potential of a non-selected word line, lower than said first power supply potential; wherein said row selecting means includes a word line driving means, operating using said third and said second power supply potentials, for supplying to a corresponding word line said third power supply potential when the word line is not selected and said second power supply potential when the word line is selected, in accordance with an address signal.

21. The semiconductor integrated circuit device according to claim 20, wherein said word line driving means includes
a plurality of row decode means provided corresponding to said word lines for activating a row selection signal in accordance with said address signal, and
a plurality of potential setting circuits provided corresponding to respective ones of said row decode means for driving potentials of corresponding word lines;

each of said potential setting circuits includes
a P channel MOS transistor receiving at its source said second power supply potential and at its gate said row selection signal, and rendered conductive when said row selection signal is activated,
potential difference reducing means provided between said P channel MOS transistor and said corresponding word line, for setting drain potential of said P channel MOS transistor to be higher than said third power supply potential and lower than said second power supply potential while said row selection signal is inactive, and
standby potential holding means for supplying said third power supply potential to said corresponding word line while said row selection signal is inactive.

22. The semiconductor integrated circuit device according to claim 18, wherein said memory means further includes
a plurality of bit line pairs provided corresponding to the columns of said dynamic type memory cells, and a plurality of sense amplifiers for amplifying potential difference generated on said bit line pairs in accordance with data held by dynamic type memory cells selected by said row selecting means;

each of said plurality of sense amplifiers is provided corresponding to a prescribed number of bit line pairs and has first and second input nodes, and said semiconductor integrated circuit device further comprises a plurality of pairs of N channel MOS transistors provided corresponding to said plurality of bit line pairs respectively, each coupled between a corresponding one of said plurality of bit line pairs and the first and the second input nodes of a corresponding one of said plurality of sense amplifiers, each of the N channel MOS transistors being rendered conductive in response to a bit line isolation signal attaining a high level that has the same potential level as the second power supply potential.

23. The semiconductor integrated circuit device according to claim 18, further comprising:

pseudo ground level generating means for outputting a pseudo ground level which is higher than said first power supply potential and lower than said internal power supply voltage; wherein said memory means further includes a plurality of bit line pairs provided corresponding to columns of said dynamic type memory cells, and a plurality of sense amplifiers, using said internal power supply voltage and said pseudo ground level, for amplifying potential difference generated on said bit line pair in accordance with data held in dynamic type memory cells selected by said row selecting means;

said row selecting means selects the corresponding row of dynamic type memory cells by setting potential of selected said word line to said second power supply potential and sets potential of not selected said word lines to said first power supply potential;

said semiconductor integrated circuit device further comprising power supply switch means receiving said first power supply potential and said pseudo ground level responsive to start of said row selecting means, for supplying said first power supply potential to said plurality of sense amplifiers for a prescribed time period and thereafter switched for supplying said pseudo ground level wherein potential of said non-selected word line is kept lower than the potential of said bit line pairs.

24. A semiconductor integrated circuit device comprising:

internal voltage converting means for supplying an internal power supply potential between a first and a second power supply potentials;

standby potential supplying means, operating using said first and second power supply potentials, for supplying a third power supply potential corresponding to a potential of a non-selected word line lower than said first power supply potential;

boosting means, operating using said first and second power supply potentials, for outputting a fourth power supply potential higher than said second power supply potential as an internal boosted potential;

memory means for holding data, including a plurality of dynamic type memory cells arranged in a matrix of rows and columns, for holding data corresponding to either said first power supply potential or said internal power supply potential, a plurality of word lines provided corresponding to the rows of said plurality of dynamic type memory cells, and row selecting means for selecting corresponding row of dynamic type memory cells by setting potential of selected said word line to said internal boosted potential, and for holding potential of non-selected word lines at said third power supply potential; and logic operation means, using said first and second power supply potentials, for performing a prescribed logic operation on data held by said memory means and outputting the result.

25. The semiconductor integrated circuit device according to claim 24, wherein said boosting means selects and outputs as said internal boosted potential, said fourth power supply potential provided by boosting said second power supply potential when said second power supply potential is lower than a prescribed potential, and said second power supply potential when said second power supply potential is higher than the prescribed potential.

26. The semiconductor integrated circuit device according to claim 25, wherein said boosting means includes an output node for outputting said internal boosted potential, an internal boosting circuit operating using said first and second power supply potentials and outputting said fourth power supply potential to said output node, reference potential generating means for outputting said prescribed potential, first comparing means for comparing said second power supply potential with said prescribed potential, switch means responsive to a result of comparison by said first comparing means for coupling said second power supply potential and said output node when said second power supply potential is higher than said prescribed potential, and second comparing means for comparing potential of said output node with said prescribed potential; and said internal boosting circuit performs boosting operation when the potential of said output node is lower than said prescribed potential, in accordance with a result of comparison by said second comparing means.

27. A semiconductor integrated circuit device comprising:

memory means for holding data, including a plurality of dynamiic type memory cells arranged in a matrix of rows and columns for holding data, one of data levels to be stored corresponding to a cell data level potential between a first and a second power supply potential, a plurality of word lines provided corresponding to a plurality of rows of said dynamic type memory cells, respectively, and row selecting means for selecting, by setting potential of selected said word line to said second power supply potential, a corresponding row of dynamic type memory cells; and logic operation means, using said first and second power supply potentials, for performing a prescribed logic operation on data held by said memory means and for outputting the result.

28. The semiconductor integrated circuit device according to claim 27, wherein
said memory means further includes
a plurality of bit line pairs provided corresponding to the columns of said dynamic type memory cells, and
a plurality of sense amplifiers for amplifying potential difference generated on said bit line pairs in accordance with data held by dynamic type memory cells selected by said row selecting means;
said semiconductor integrated circuit device further comprising
power supply switch means receiving said second power supply potential and said cell data level potential, for supplying, in response to start of row selecting operation, said second power supply potential to said plurality of sense amplifiers for a prescribed period and thereafter switched for supplying said cell data level potential.

29. The semiconductor integrated circuit device according to claim 27, further comprising:
standby potential supplying means, operating using said first and second power supply potentials, for supplying a third power supply potential corresponding to a potential of a non-selected word line, lower than said first power supply potential; wherein
said row selecting means includes a word line driving means, operating using said third and said second power supply potentials, for supplying to a corresponding word line said third power supply potential when the word line is not selected and said second power supply potential when the word line is selected, in accordance with an address signal.

30. The semiconductor integrated circuit device according to claim 29, wherein
said word line driving means includes
a plurality of row decode means provided corresponding to said word lines for activating a row selection signal in accordance with said address signal, and
a plurality of potential setting circuits provided corresponding to respective ones of said row decode means for driving potentials of corresponding word lines;
each of said potential setting circuits includes
a P channel MOS transistor receiving at its source said second power supply potential and at its gate said row selection signal, and rendered conductive when said row selection signal is activated,
potential difference reducing means provided between said P channel MOS transistor and said corresponding word line, for setting drain potential of said P channel MOS transistor to be higher than said third power supply potential and lower than said second power supply potential while said row selection signal is inactive, and
standby potential holding means for supplying said third power supply potential to said corresponding word line while said row selection signal is inactive.

31. The semiconductor integrated circuit device according to claim 27, wherein
said memory means further includes
a plurality of bit line pairs provided corresponding to the columns of said dynamic type memory cells, and
a plurality of sense amplifiers for amplifying potential difference generated on said bit line pairs in accordance with data held by dynamic type memory cells selected by said row selecting means;
each of said plurality of sense. amplifiers is provided corresponding to a prescribed number of bit line pairs and has first and second input nodes, and
said semiconductor integrated circuit device further comprises
a plurality of pairs of N channel MOS transistors provided corresponding to said plurality of bit line pairs respectively, each coupled between a corresponding one of said plurality of bit line pairs and the first and the second input nodes of a corresponding one of said plurality of sense amplifiers, each of the N channel MOS transistors being rendered conductive in response to a bit line isolation signal attaining a high level that has the same potential level as the second power supply potential.

32. The semiconductor integrated circuit device according to claim 27, further comprising:
pseudo ground level generating means for outputting a pseudo ground level which is higher than said first power supply potential and lower than said cell data level potential; wherein
said memory means further includes
a plurality of bit line pairs provided corresponding to columns of said dynamic type memory cells, and
a plurality of sense amplifiers, using said cell data level potential and said pseudo ground level, for amplifying potential difference generated on said bit line pair in accordance with data held in dynamic type memory cells selected by said row selecting means;
said row selecting means selects the corresponding row of dynamic type memory cells by setting potential of selected said word line to said second power supply potential and sets potential of not selected said word lines to said first power supply potential;
said semiconductor integrated circuit device further comprising
power supply switch means receiving said first power supply potential and said pseudo ground level responsive to start of said row selecting means, for supplying said first power supply potential to said plurality of sense amplifiers for a prescribed time period and thereafter switched for supplying said pseudo ground level wherein
potential of said non-selected word line is kept lower than the potential of said bit line pairs.

33. A semiconductor integrated circuit device comprising:
standby potential supply means, operating using a first and a second power supply potential, for supplying a third power supply potential corresponding to a potential of a non-selected word line lower than said first power supply potential;
boosting means, operating using said first and second power supply potentials, for outputting a fourth power supply potential higher than said second power supply potential as an internal boosted potential;
memory means for holding data, including
a plurality of dynamic type memory cells arranged in a matrix of rows and columns, for holding data corresponding to either said first power supply potential or a cell data level potential between said first and said second power supply potentials, a plurality of word lines provided corresponding to the rows of said plurality of dynamic type memory cells, and row selecting means for selecting corresponding row of dynamic type memory cells by setting potential of selected said word line to said internal boosted potential, and for holding potential of non-selected word lines at said third power supply potential; and logic operation means, using said first and second power supply potentials, for performing a prescribed logic operation on data held by said memory means and outputting the result.

34. The semiconductor integrated circuit device according to claim 33, wherein said boosting means selects and outputs as said internal boosted potential, said fourth power supply potential provided by boosting said second power supply potential when said second power supply potential is lower than a prescribed potential, and said second power supply potential when said second power supply potential is higher than the prescribed potential.

35. The semiconductor integrated circuit device according to claim 34, wherein said boosting means includes an output node for outputting said internal boosted potential, an internal boosting circuit operating using said first and second power supply potentials and outputting said fourth power supply potential to said output node, reference potential generating means for outputting said prescribed potential, first comparing means for comparing said second power supply, potential with said prescribed potential, switch means responsive to a result of comparison by said first comparing means for coupling said second power supply potential and said output node when said second power supply potential is higher than said prescribed potential, and second comparing means for comparing potential of said output node with said prescribed potential; and said internal boosting circuit performs boosting operation when the potential of said output node is lower than said prescribed potential, in accordance with a result of comparison by said second comparing means.

* * * * *